United States Patent
Morikawa et al.

(10) Patent No.: US 8,803,119 B2
(45) Date of Patent: Aug. 12, 2014

(54) SEMICONDUCTOR MEMORY DEVICE AND MANUFACTURING METHOD OF THE SAME

(71) Applicant: National Institute of Advanced Industrial Science and Technology, Tokyo (JP)

(72) Inventors: Takahiro Morikawa, Ibaraki (JP); Toshimichi Shintani, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 13/773,799

(22) Filed: Feb. 22, 2013

(65) Prior Publication Data
US 2013/0221310 A1  Aug. 29, 2013

(30) Foreign Application Priority Data
Feb. 24, 2012  (JP) ................................ 2012-038728

(51) Int. Cl.
*H01L 29/02*  (2006.01)

(52) U.S. Cl.
USPC .................. 257/2; 257/3; 257/4; 257/E21.35; 438/95; 438/96; 438/166; 438/135

(58) Field of Classification Search
USPC ......... 365/174, 163, 64, 94; 438/96; 257/2–5, 257/9, E21.35, E31.047
See application file for complete search history.

(56) References Cited

U.S. PATENT DOCUMENTS 8,335,106 B2   12/2012   Aizawa et al.

FOREIGN PATENT DOCUMENTS

JP   2010-263131 A   11/2010

OTHER PUBLICATIONS

Article entitled "Interfacial phase-change memory" by R. E. Simpson et al., Nature nanotechnology, published online Jul. 3, 2011; pp. 1-5.

*Primary Examiner* — Mark A Laurenzi
(74) *Attorney, Agent, or Firm* — McCormick, Paulding & Huber LLP

(57) ABSTRACT

A technique capable of improving performances of a semiconductor memory device provided with a recording film having a super lattice structure is provided. The semiconductor memory device records information by changing an electric resistance of a recording film by use of a change in an atomic arrangement of the recording film. Moreover, the recording film is provided with a stacked layer portion in which a first crystal layer and a second crystal layer made of chalcogen compounds having respectively different compositions are stacked, an orientation layer that enhances an orientation of the stacked layer portion, and an adhesive layer that improves the flatness of the orientation layer.

13 Claims, 32 Drawing Sheets

SEMICONDUCTOR MEMORY DEVICE AND MANUFACTURING METHOD OF THE SAME

CROSS-REFERENCE TO RELATED APPLICATION

The present application claims priority from Japanese Patent Application No. 2012-038728 filed on Feb. 24, 2012, the content of which is hereby incorporated by reference into this application.

TECHNICAL FIELD OF THE INVENTION

The present invention relates to a semiconductor memory device, and in particular to a semiconductor memory device that records information by changing an electric resistance of a recording film.

BACKGROUND OF THE INVENTION

As a memory (semiconductor memory device) that is used in place of a flash memory whose memory cell has been approaching a limitation in its miniaturization, a resistance change memory that records information by changing an electric resistance (hereinafter, simply referred to also as "resistance") of a recording film has been studied. As an example of such a resistance change memory, a phase change memory provided with a memory cell having a structure in which a recording film made of a chalcogen compound such as $Ge_2Sb_2Te_5$ is sandwiched between two electrodes has been extensively studied.

A phase change memory having the above-mentioned recording film made of a chalcogen compound records information by utilizing the fact that resistance of the recording film differs depending on whether the chalcogen compound is in an amorphous state or a crystalline state. More specifically, the above-mentioned chalcogen compound has a high resistance in an amorphous state (high resistance state) and has a low resistance in a crystalline state (low resistance state). Therefore, reading of information recorded in the recording film is carried out by measuring an electric current that flows in the recording film when a voltage is applied between the two electrodes sandwiching the recording film and determining whether the recording film is in the high resistance state or in the low resistance state.

Moreover, recording of information onto the recording film, that is, writing thereof is carried out by applying a voltage between the two electrodes sandwiching the recording film to pass an electric current through the recording film so as to generate a Joule heat, thereby changing the chalcogen compound forming the recording film between the amorphous state (high resistance state) and the crystalline state (low resistance state). As the operations for the writing described above, a resetting operation and a setting operation are carried out. In the resetting operation, the recording film is changed from the low resistance state (crystalline state) to the high resistance state (amorphous state), and for example, this operation is carried out through a process in which, after the chalcogen compound forming the recording film is once melted by passing a large electric current through the recording film for a short period of time, the chalcogen compound is then rapidly cooled by quickly reducing the electric current. On the other hand, in the setting operation, the recording film is changed from the high resistance state (amorphous state) to the low resistance state (crystalline state), and for example, this operation is carried out through a process in which, by passing an electric current through the recording film for a long period of time, the chalcogen compound forming the recording film is maintained at a crystallization temperature at which the chalcogen compound is crystallized.

In accordance with the above-mentioned writing principle, since an electric current required for changing the chalcogen compound between the high resistance state and the low resistance state becomes smaller as the memory cell is miniaturized, the phase change memory is suitable for the miniaturization of the memory cell, so that its studies have been extensively carried out.

In order to further improve performances of the semiconductor memory device made up of the phase change memory like this, the phase change memory provided with a recording film having a super lattice structure has been proposed (see Japanese Patent Application Laid-Open Publication No. 2010-263131 (Patent Document 1) and R. E. Simpson et al, "Interfacial phase-change memory", Nature Nanotechnology, Vol. 6, pp. 501-505, 2011 (Patent Document 2)). In this phase change memory, the recording film is not made of generally used $Ge_2Sb_2Te_5$, but is configured to have a super lattice structure in which very thin crystal layers made of GeTe and very thin crystal layers made of $Sb_2Te_3$ are alternately stacked repeatedly, and by reversibly moving positions of the constituent atoms of the crystal layers made of GeTe, the electric resistance of the recording film is changed.

SUMMARY OF THE INVENTION

However, when the inventors of the present invention have examined the phase change memory (semiconductor memory device) provided with the recording film having the above-mentioned super lattice structure, it has been found that following problems are raised.

In the case where the recording film has a super lattice structure in which crystal layers (first crystal layers) made of GeTe and crystal layers (second crystal layers) made of $Sb_2Te_3$ are alternately stacked repeatedly, directions in which the positions of the constituent atoms of the recording film are moved can be aligned when the stacking surface of the first crystal layer is (111)-oriented, so that an electric current required for the writing operation (programming operation) of information to the recording film can be made smaller. Therefore, in order to orient the stacking surface of the first crystal layer, an orientation layer made of a chalcogen compound is formed as a base layer of the super lattice structure. Moreover, it is effective that this orientation layer itself is also oriented, and for this reason, it is preferable that, at the time when the orientation layer is formed, the temperature of the substrate is set to a high temperature of 100° C. or higher.

However, in the case where the temperature of the substrate is high when the orientation layer made of a chalcogen compound is to be formed, the orientation layer is likely to be aggregated. For this reason, when the orientation layer has a small film thickness, the orientation layer grows into an island pattern (in the form of islands), and the flatness of the surface of the orientation layer is lowered. In contrast, when the orientation layer has a large film thickness, the orientation layer is formed as a continuous film so as to cover the entire substrate instead of the island pattern (in the form of islands). However, irregularities caused by the growth into an island pattern (in the form of islands) in the initial stage of the growth are left on the surface of the orientation layer, so that the surface flatness of the orientation layer is lowered.

As a result, the flatness of the stacking surface of the first crystal layer is lowered, directions in which the positions of constituent atoms are moved cannot be aligned, the electric current required for the writing operation (programming operation) is increased, and performances of the semiconductor memory device are degraded. Moreover, in the subsequent manufacturing processes, when dry etching is carried out so as to separate the recording film for each of the memory cells, since part of the recording film is left without being etched, the processing precision is lowered, so that the resistance value of the recording film varies in each of the respective memory cells, and the performances of the semiconductor memory device are degraded.

An object of the present invention is to provide a technique capable of improving performances of a semiconductor memory device provided with a recording film having a super lattice structure.

The above and other objects and novel characteristics of the present invention will be apparent from the description of the present specification and the accompanying drawings.

The following is a brief description of an outline of the typical invention disclosed in the present application.

A semiconductor memory device according to a typical embodiment is provided with a stacked layer portion in which a first crystal layer and a second crystal layer made of chalcogen compounds having respectively different compositions and an orientation layer for improving the orientation of the stacked layer portion, and is further provided with an adhesive layer for improving the flatness of the orientation layer.

The effects obtained by typical embodiments of the inventions disclosed in the present application will be briefly described below.

According to typical embodiments, it is possible to improve performances of the semiconductor memory device.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments, and the repetitive description thereof will be omitted. In addition, the description of the same or similar portions is not repeated in principle unless particularly required in the following embodiments. Furthermore, in some drawings for describing the following embodiments, hatching is used even in a plan view so as to make the drawings easy to see.

First Embodiment

A semiconductor memory device according to the first embodiment of the present invention will be described with reference to the drawings. The semiconductor memory device according to the present embodiment is a phase change memory provided with a recording film having a super lattice structure.

Figure 1:
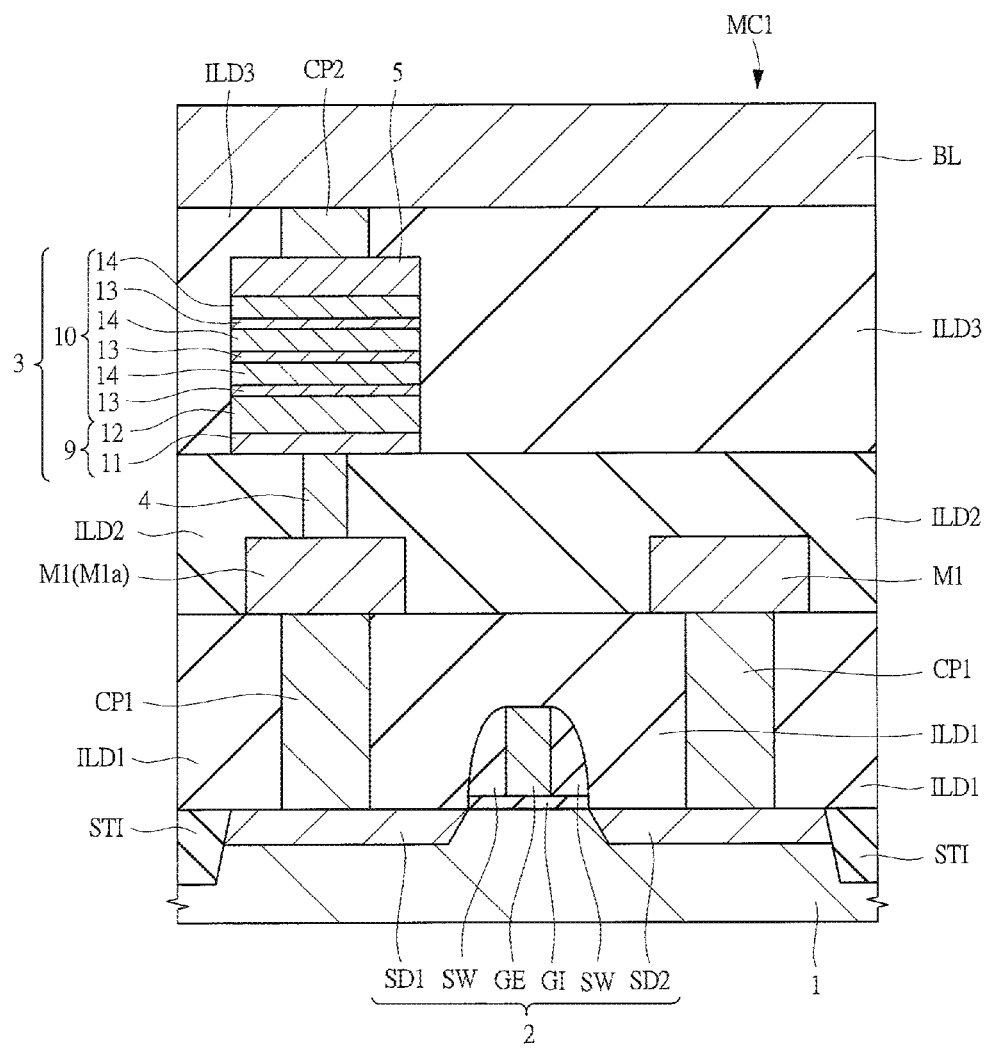
FIG. 1 is a cross-sectional view showing a principal part of a memory cell of a semiconductor memory device of the first embodiment.

First, a structure of a memory cell MC1 of the semiconductor memory device of the present embodiment will be described. FIG. 1 is a cross-sectional view showing a principal part of the memory cell MC1 of the semiconductor memory device of the first embodiment.

As shown in FIG. 1, the memory cell MC1 includes an MISFET (Metal Insulator Semiconductor Field Effect Transistor) 2 formed on a main surface of a semiconductor substrate 1 made of, for example, single crystalline silicon and serving as a selection transistor for selecting the memory cell MC1 and a recording film 3 formed on the upper side of the MISFET 2 and having a super lattice structure. As will be described later, the memory cell MC1 records information by switching the resistance (electric resistance) state of the recording film 3 between a low resistance state and a high resistance state by utilizing the change in the atomic arrangement or atomic position of the recording film 3.

In the present specification, the state in which the resistance (electric resistance) of the recording film 3 is relatively low (low resistance state) is referred to as "set state" and the state in which the resistance (electric resistance) of the recording film 3 is relatively high (high resistance state) is referred to as "reset state". Moreover, an operation for switching the recording film 3 from the high resistance state to the low resistance state is referred to as "setting operation" and an operation for switching the recording film 3 from the low resistance state to the high resistance state is referred to as "resetting operation".

Moreover, in the present embodiment, an example using the semiconductor substrate 1 is described, but a substrate obtained by forming a semiconductor layer on other various types of substrates such as a glass substrate or the like may also be used in place of the semiconductor substrate 1.

As shown in FIG. 1, on the main surface of the semiconductor substrate 1, a gate electrode GE is formed via a gate insulating film GI, and a drain SD1 and a source SD2 are formed in the main surface of the semiconductor substrate 1 so as to sandwich the gate electrode GE. The drain SD1, the source SD2 and the gate electrode GE constitute the MISFET 2. The sidewall of the gate electrode GE is covered with a sidewall spacer SW, and the sidewall spacer SW also serves as one component of the MISFET 2. Although the illustration thereof is omitted in FIG. 1, the gate electrode GE is electrically connected to a word line WL (see FIG. 2 to be described later) made of, for example, tungsten (W), and the drain SD1 is electrically connected to a bit line BL via a wire M1, the recording film 3 and the like as will be described later.

In the main surface of the semiconductor substrate 1, an element isolation layer STI is formed so as to be in contact with the drain SD1 or the source SD2, and on the semiconductor substrate 1, an interlayer insulating film ILD1 made of, for example, silicon oxide is formed so as to cover the gate electrode GE and the element isolation layer STI.

On the interlayer insulating film ILD1, a wire M1 made of, for example, metal is formed, and the lower portion of the wire M1 is electrically connected to the drain SD1 or the source SD2 through a contact plug CP1 made of, for example, W or the like and formed so as to penetrate the interlayer insulating film ILD1.

On the interlayer insulating film ILD1, an interlayer insulating film ILD2 made of, for example, silicon oxide is formed so as to cover the wire M1. In a part of the interlayer insulating film ILD2 on an upper part of a wire M1a electrically connected to the drain SD1, a lower electrode 4 is formed so as to penetrate the interlayer insulating film ILD2. A lower portion of the lower electrode 4 is electrically connected to the upper portion of the wire M1a.

On the interlayer insulating film ILD2, the recording film 3 is formed. The detailed structure and materials of the recording film 3 will be described later. A lower portion of the recording film 3 is electrically connected to an upper portion of the lower electrode 4. More specifically, the lower portion of the recording film 3 is electrically connected to the drain SD1 via the lower electrode 4, the wire M1a, and the contact plug CP1. Moreover, an upper electrode 5 is formed on the recording film 3, and a lower portion of the upper electrode 5 is electrically connected to the upper portion of the recording film 3.

On the interlayer insulating film ILD2, an interlayer insulating film ILD3 made of, for example, silicon oxide is formed so as to cover the recording film 3 and the upper electrode 5. In a part of the interlayer insulating film ILD3 on the upper side of the upper electrode 5, a contact plug CP2 made of, for example, W or the like is formed so as to penetrate the interlayer insulating film ILD3. A lower portion of the contact plug CP2 is electrically connected to an upper portion of the upper electrode 5.

A bit line BL made of, for example, W or the like is formed on the interlayer insulating film ILD3. A lower portion of the bit line BL is electrically connected to an upper portion of the contact plug CP2. More specifically, the upper portion of the recording film 3 is electrically connected to the bit line BL via the upper electrode 5 and the contact plug CP2. Therefore, as described above, the drain SD1 is electrically connected to the bit line BL via the contact plug CP1, the wire M1a, the lower electrode 4, the recording film 3, the upper electrode 5 and the contact plug CP2. Here, the bit line BL is further connected to other circuits.

The lower electrode 4 and the upper electrode 5 are composed of conductive films made of metal or the like. Specific materials of the conductive films forming the lower electrode 4 and the upper electrode 5 include metal materials such as aluminum (Al), copper (Cu), tungsten (W) and titanium (Ti), metal nitrides such as titanium nitride (TiN) or tungsten nitride (WN), metal silicides such as titanium silicide (TiSi) or cobalt silicide (CoSi), polycrystalline silicon (polysilicon) doped with an n-type or p-type impurity, and others.

Incidentally, FIG. 1 shows an example of a cross-sectional view of one memory cell MC1 taken along an extending direction of the bit line BL (second direction to be described later). However, actually, a plurality of memory cells MC1 are densely disposed on the semiconductor substrate 1 in a matrix pattern when seen in a plan view so as to correspond to an equivalent circuit diagram which will be described later with reference to FIG. 2.

Figure 2:
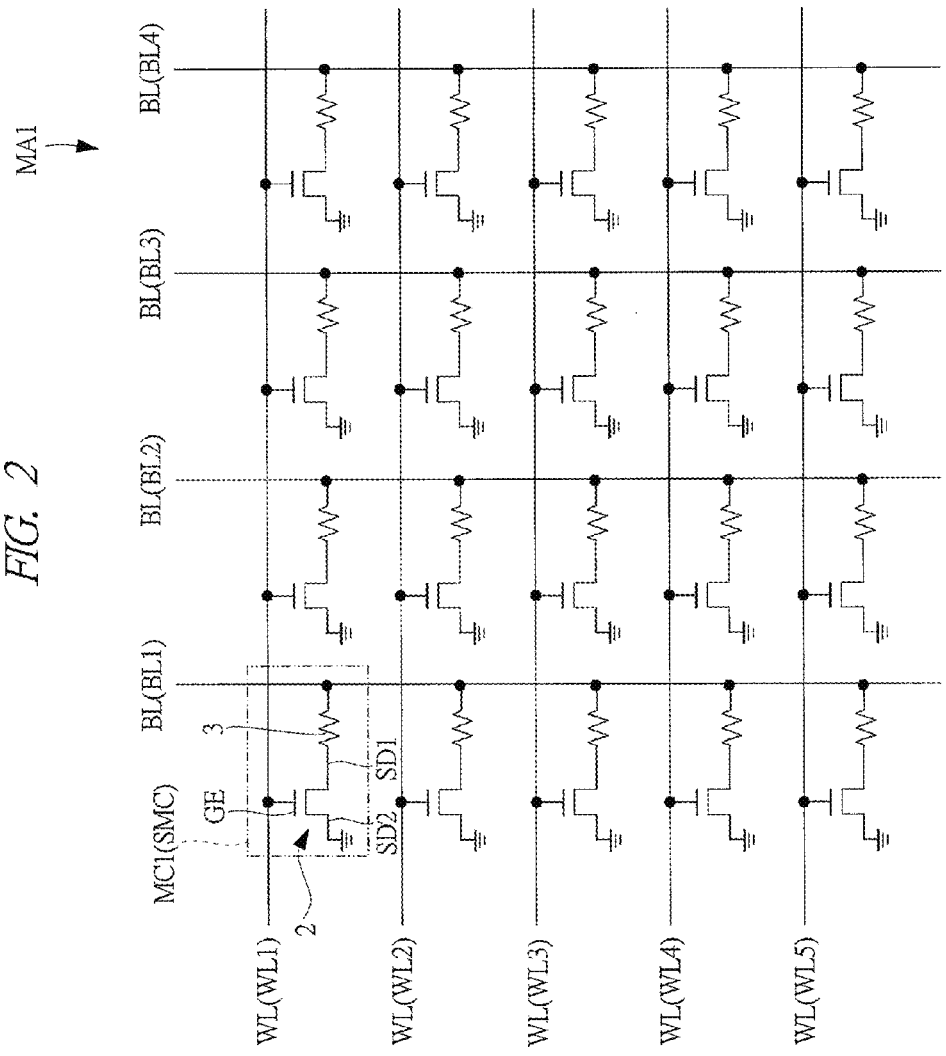
FIG. 2 is an equivalent circuit diagram showing an example of the configuration of a memory cell array of the semiconductor memory device of the first embodiment.

Next, an example of a configuration of a memory cell array MA1 of a semiconductor memory device will be described. FIG. 2 is the equivalent circuit diagram showing an example of the configuration of the memory cell array MA1 of the semiconductor memory device of the first embodiment.

As shown in FIG. 2, the semiconductor memory device of the present embodiment is provided with the memory cell array MA1 including a plurality of word lines WL (WL1 to WL5) that extend in a first direction, a plurality of bit lines BL (BL1 to BL4) that extend in a second direction intersecting the first direction, and a plurality of memory cells MC1 disposed in regions at which each word line WL and each bit line BL intersect with each other. The memory cell MC1 is provided with the MISFET 2 and the recording film 3. The gate electrode GE of the MISFET 2 is connected to the word line WL, and the drain SD1 of the MISFET 2 is connected to the bit line BL via the recording film 3. Moreover, the source SD2 of the MISFET 2 is grounded.

Incidentally, in FIG. 2, the recording film 3 is represented as a resistance component. Moreover, in FIG. 2, for simplicity of illustration, only one of the plurality of memory cells MC1 disposed in the regions at which each word line WL and each bit line BL intersect with each other is denoted by a reference numeral.

Operations of the memory cell MC1 thus configured are carried out in the following manner. First, for example, 5 V is applied to the word line WL 1 connected to the gate electrode GE of the memory cell MC1 serving as the selection cell SMC so as to bring the MISFET 2 of the selection cell SMC into an ON state. Moreover, to the bit line BL1 connected to the drain SD1 of the selection cell SMC via the recording film 3, for example, 5 V, 4 V, and 2 V are applied at the time of a resetting operation, a setting operation, and a reading operation, respectively. Moreover, the electric potential of the word lines WL2, WL3, WL4 and WL5 other than the word line WL1 is set to, for example, 0 V, and the electric potential of the bit lines BL2, BL3 and BL4 other than the bit line BL1 is set to, for example, 0 V.

At this time, since the MISFET 2 is in the ON state, an electric current flows through the recording film 3 in the selection cell SMC. At the time of carrying out the resetting operation, by applying a thermal energy by the electric current (programming current for resetting operation) flowing through the recording film 3 of the selection cell SMC, the atomic arrangement or the atomic position of the recording film 3 is changed, thereby changing the resistance value of the recording film 3 to the high resistance state. At the time of carrying out the setting operation, by applying a thermal energy by the electric current (programming current for set operation) flowing through the recording film 3 of the selection cell SMC, the atomic arrangement or the atomic position of the recording film 3 is changed, thereby changing the resistance value of the recording film 3 to the low resistance state. At the time of carrying out a reading operation, the value of an electric current flowing through the recording film 3 of the selection cell SMC is determined.

On the other hand, in the memory cell connected to one of the bit lines BL2, BL3 and BL4 and also the word line WL1, since the electric potential of the bit lines BL2, BL3 and BL4 is 0 V and there is no electric potential difference between the two ends of the recording film, no electric current flows. Moreover, in the memory cell connected to one of the bit lines BL1, BL2, BL3 and BL4 and also one of the word lines WL2, WL3, WL4 and WL5, since the MISFET is in the OFF state, no electric current flows.

Figure 3:
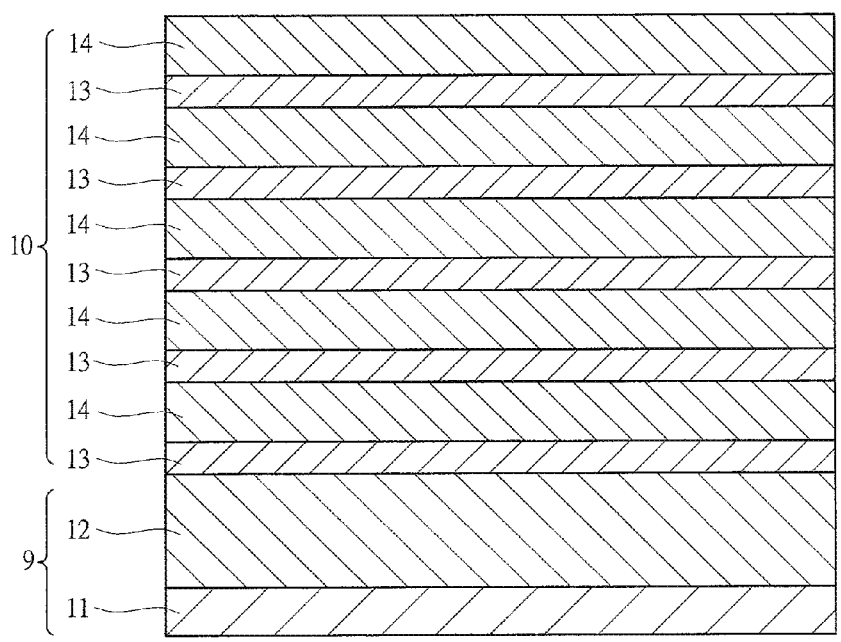
FIG. 3 is a cross-sectional view showing a recording film of the semiconductor memory device of the first embodiment.

Next, the detailed structure and materials of the recording film 3 in the memory cell MC1 of the semiconductor memory device according to the present embodiment will be described. FIG. 3 is a cross-sectional view showing the recording film 3 of the semiconductor memory device of the first embodiment.

As shown in FIGS. 1 and 3, the recording film 3 includes a base portion 9 formed on the lower electrode 4 and a stacked layer portion 10 formed on the base portion 9. The base portion 9 has a structure in which a first base layer (adhesive layer) 11 and a second base layer (orientation layer) 12 are sequentially stacked on the lower electrode 4. The stacked layer portion 10 has a structure in which first crystal layers 13 made of a first chalcogen compound and second crystal layers 14 made of a second chalcogen compound having a composition different from that of the first chalcogen compound are alternately stacked repeatedly. More specifically, the recording film 3 has a structure in which the first base layer (adhesive layer) 11, the second base layer (orientation layer) 12, and the stacked layer portion 10 composed of the first crystal layers 13 and the second crystal layers 14 alternately stacked repeatedly are sequentially formed in this order from the lower electrode 4 side. In the stacked layer portion 10, the first crystal layers 13 and the second crystal layers 14 are stacked in a direction perpendicular to the main surface of the semiconductor substrate 1. Moreover, as described above, the upper electrode 5 is formed on the recording film 3, so that the recording film 3 is sandwiched between the lower electrode 4 and the upper electrode 5.

As will be described later, the second base layer (orientation layer) 12 has a function of improving the orientation of the stacked layer portion 10, and the first base layer (adhesive layer) 11 has a function of preventing aggregation of the second base layer (orientation layer) 12 so as to improve the flatness of the surface of the second base layer (orientation layer) 12.

In the stacked layer portion 10, the first crystal layers 13 and the second crystal layers 14 are alternately formed repeatedly, and the stacked layer portion 10 has a super lattice structure. In this case, "super lattice" refers to a crystal lattice that has a longer periodic structure than that of a basic unit lattice because plural types of crystal lattices are alternately deposited repeatedly, and "super lattice structure" refers to a crystal structure composed of crystal lattices of such "super lattice" (the same is true for the following embodiments). Note that, as the stacked layer portion 10, a structure in which one first crystal layer 13 and one second crystal layer 14 are stacked may be used in place of the structure in which the first crystal layers 13 and the second crystal layers 14 are alternately stacked repeatedly.

As described above, the memory cell MC1 records information by changing the resistance (electric resistance) of the recording film 3 by utilizing a change of the atomic arrangement or atomic position of the recording film 3. Therefore, a chalcogen compound (first chalcogen compound) of the first crystal layer 13 is preferably a material whose resistance is greatly changed by the change of the atomic arrangement or atomic position and which requires small energy for the change of the atomic arrangement or atomic position. More specifically, the chalcogen compound (first chalcogen compound) of the first crystal layer 13 is preferably a material whose resistance is greatly changed even by a slight change of the bonding state of the constituent atoms and which requires small energy for the change of the bonding state. As such materials, preferably, a chalcogen compound that contains germanium (Ge), tin (Sn) or manganese (Mn) and has a NaCl-type crystal structure (cubic crystal) in a low resistance state, for example, GeTe or the like containing germanium (Ge) and tellurium (Te) may be used. This is because the chalcogen compound that contains Ge, Sn or Mn and has a NaCl-type crystal structure (cubic crystal) in a low resistance state can change the atomic arrangement or atomic position, that is, the bonding state of the constituent atoms just by passing a small amount of current through it.

Moreover, in the case where the chalcogen compound that contains Ge, Sn or Mn and has a NaCl-type crystal structure (cubic crystal) in a low resistance state is used as the first chalcogen compound, preferably, the stacking surface of the first crystal layer 13 is (111)-oriented. In this case, the state that "the stacking surface is (111)-oriented" means that the stacking surface is in parallel with the (111) plane of the cubic crystal. As will be described later, when the stacking surface of the first crystal layer 13 is (111)-oriented, the atomic arrangement or atomic position, that is, the bonding state of the constituent atoms can be easily changed just by passing a small amount of an electric current.

The thickness of each of the first crystal layers 13 is preferably 0.33 nm or more to 2.0 nm or less. In the case where the thickness of the first crystal layer 13 is less than 0.33 nm, the thickness of the first crystal layer 13 becomes smaller than the thickness corresponding to one lattice portion of the first chalcogen compound, with the result that it becomes difficult to move atoms in the same direction over the entire first crystal layer 13. Moreover, in the case where the thickness of the first crystal layer 13 exceeds 2.0 nm, the characteristic as a bulk material becomes stronger than the characteristic as a thin film in the first crystal layer 13, so that atoms in the first crystal layer 13 are likely to move not in the same direction, but in random directions, with the result that a current required for changing the bonding state is increased.

On the other hand, the chalcogen compound (second chalcogen compound) of the second crystal layer 14 is preferably a material that allows the change in the atomic arrangement or the atomic position of the chalcogen compound (first chalcogen compound) of the first crystal layer 13, that is, the change in the bonding state of the constituent atoms to easily occur when stacked together with the first crystal layer 13, thereby improving the life against the repetitive changes. The atomic arrangement or atomic position of the second chalcogen compound, that is, the bonding state or structure of the constituent atoms may be changed or may not be changed together with the change in the atomic arrangement or atomic position of the first chalcogen compound, that is, the change in the bonding state of constituent atoms. As such materials, a chalcogen compound having a hexagonal crystal structure such as $Sb_2Te_3$ containing antimony (Sb) and tellurium (Te), $Bi_2Te_3$ containing bismuth (Bi) and tellurium (Te), $HfTe_2$ containing hafnium (Hf) and tellurium (Te), $Cu_2Te$ containing copper (Cu) and tellurium (Te), SnTe containing tin (Sn) and tellurium (Te) or the like may be used. Alternatively, as the material of the second crystal layer 14, antimony (Sb) having the hexagonal crystal structure may be used.

Moreover, in the case where the stacking surface of the first crystal layer 13 is (111)-oriented, preferably, the stacking surface of the second crystal layer 14 is (001)-oriented, that is, c-axis oriented. In this case, the state that "the stacking surface is (001)-oriented" means that the stacking surface is in parallel with the (001) plane of the hexagonal crystal, and the state that "the stacking surface is c-axis oriented" means that the stacking surface is perpendicular to the c-axis of the hexagonal crystal. In the case where the stacking surface of the second crystal layer 14 is (001)-oriented, since the (111) plane of the first crystal layer 13 and the (001) plane of the second crystal layer 14 are lattice-matched with each other, the stacking surface of the first crystal layer 13 to be stacked on the second crystal layer 14 can be easily (111)-oriented. As a result, the atomic arrangement or atomic position, that is, the bonding state of the constituent atoms can be easily changed just by passing a small amount of an electric current.

The thickness of each of the second crystal layers 14 is preferably 1.0 nm or more to 10 nm or less. This is because when the thickness of the second crystal layer 14 is less than 1.0 nm, the thickness of the second crystal layer 14 becomes smaller than the thickness corresponding to one lattice portion of the second chalcogen compound, with the result that it becomes difficult to stack the second crystal layer 14, while maintaining the lattice matching state with the first crystal layer 13. Moreover, in the case where the thickness of the second crystal layer 14 exceeds 10 nm, if the total thickness of the stacked layer portion 10 is fixed, the number of repetitive stacking of the first crystal layers 13 and the second crystal layers 14 becomes smaller, with the result that an amount of change in the resistance between the low resistance state and the high resistance state becomes smaller.

The second base layer (orientation layer) 12 enhances (improves) the orientation of the stacked layer portion 10 in which the first crystal layers 13 and the second crystal layers 14 are alternately stacked repeatedly. Although not particularly limited as long as it has a function of improving the orientation of the stacked layer portion 10, the material of the second base layer (orientation layer) 12 is preferably a material having a hexagonal crystal structure from the viewpoint that the second base layer (orientation layer) 12 itself is easily (001)-oriented or c-axis oriented. This is because when the second base layer (orientation layer) 12 is (001)-oriented or c-axis oriented, the orientation of the stacked layer portion 10 can be improved by making the (111) plane of the first crystal layer 13 formed on the second base layer (orientation layer) 12 lattice-matched with the (001) plane of the second base layer (orientation layer) 12. As a material of this second base layer (orientation layer) 12, for example, Sb, $Sb_2Te_3$ or $Bi_2Te_3$, or the like may be used.

The state that the second base layer (orientation layer) 12 is (001)-oriented or c-axis oriented means that the second base layer (orientation layer) 12 has a hexagonal crystal structure, and the c-axis of the hexagonal crystal is oriented perpendicularly to the surface of the first base layer (adhesive layer) 11.

Alternatively, as the material of the second base layer (orientation layer) 12, the same material as that for the chalcogen compound (second chalcogen compound) of the second crystal layer 14 may be used. In the case where the same material as that for the second chalcogen compound is used as the material of the second base layer (orientation layer) 12, since the second base layer (orientation layer) 12 and the second crystal layer 14 can be formed by the same film-forming method, the manufacturing process can be simplified.

The thickness of the second base layer (orientation layer) 12 is preferably 1.0 nm or more to 10 nm or less. This is because when the thickness of the second base layer (orientation layer) 12 is less than 1.0 nm, the thickness of the second base layer (orientation layer) 12 becomes smaller than the thickness corresponding to one lattice portion of the material, with the result that the second base layer (orientation layer) 12 is not c-axis oriented and it becomes difficult to improve the orientation of the stacked layer portion 10. Moreover, in the case where the thickness of the second base layer (orientation layer) 12 exceeds 10 nm, if the total thickness of the recording film 3 is fixed, the number of repetitive stacking of the first crystal layers 13 and the second crystal layers 14 becomes smaller, with the result that an amount of change in the resistance between the low resistance state and the high resistance state becomes smaller.

Moreover, the second base layer (orientation layer) 12 is preferably a continuous film, that is, it is formed so as to cover the entire first base layer (adhesive layer) 11 in a region where the second base layer (orientation layer) 12 is to be formed, and also for this reason, the thickness of the second base layer (orientation layer) 12 is preferably 1.0 nm or more as described above.

The first base layer (adhesive layer) 11 prevents the aggregation of the second base layer (orientation layer) 12 in the initial stage of the film-forming process of the second base layer (orientation layer) 12, and improves the flatness of the surface of the second base layer (orientation layer) 12. Although not particularly limited as long as it has a function of improving the flatness of the surface of the second base layer (orientation layer) 12, the material of the first base layer (adhesive layer) 11 is preferably a nitride or an oxide of a transition metal.

For example, in the case where a chalcogen compound containing Te is used as the material of the second base layer (orientation layer) 12 and an oxide of a transition metal is used as the material of the first base layer (adhesive layer) 11, since Te and oxygen are in the same group of the periodic table, Te atoms of the second base layer (orientation layer) 12 and oxygen atoms of the first base layer (adhesive layer) 11 are easily exchanged (substituted) with each other in the initial stage of the film-forming process of the second base layer (orientation layer) 12. Moreover, after the Te atoms of the second base layer (orientation layer) 12 and the oxygen atoms of the first base layer (adhesive layer) 11 are exchanged (substituted) with each other, since the material of the second base layer (orientation layer) 12 to be formed is easily adhered to the surface of the first base layer (adhesive layer) 11, a high adhesion property of the second base layer (orientation layer) 12 onto the first base layer (adhesive layer) 11 is obtained. In this case, since the material of the second base layer (orientation layer) 12 is adhered to the entire surface of the first base layer (adhesive layer) 11 instead of that the material of the second base layer (orientation layer) 12 is adhered to a part of the surface of the first base layer (adhesive layer) 11, the aggregation of the second base layer (orientation layer) 12 on the first base layer (adhesive layer) 11 can be prevented, so that it becomes possible to improve the flatness of the surface of the second base layer (orientation layer) 12.

On the other hand, in the case where a compound containing Sb or Bi is used as the material of the second base layer (orientation layer) 12 and a nitride of a transition metal is used as the material of the first base layer (adhesive layer) 11, since Sb or Bi and nitrogen are in the same group of the periodic table, Sb or Bi atoms of the second base layer (orientation layer) 12 and nitrogen atoms of the first base layer (adhesive layer) 11 are easily exchanged (substituted) with each other in the initial stage of the film-forming process of the second base layer (orientation layer) 12. Also in this case, like the case described above, the aggregation of the second base layer (orientation layer) 12 on the first base layer (adhesive layer) 11 can be prevented, so that it is possible to improve the flatness of the surface of the second base layer (orientation layer) 12.

More preferably, a nitride or an oxide of a transition metal which easily forms a compound with an element constituting the second base layer (orientation layer) 12 such as Te, Sb or Bi is used as the material of the first base layer (adhesive layer) 11. Such materials include a nitride or an oxide of titanium (Ti), manganese (Mn), zirconium (Zr), chromium (Cr), nickel (Ni), cobalt (Co) or iron (Fe). In this manner, the aggregation of the second base layer (orientation layer) 12 on the first base layer (adhesive layer) 11 can be further prevented, and it becomes possible to further improve the flatness of the surface of the second base layer (orientation layer) 12.

The thickness of the first base layer (adhesive layer) 11 is preferably 0.5 nm or more to 2 nm or less. In order to prevent the aggregation of the second base layer (orientation layer) 12, the first base layer (adhesive layer) 11 is preferably a continuous film, that is, it is formed so as to cover the entire base layer in a region where the first base layer (adhesive layer) 11 is to be formed, and for this reason, the thickness of the first base layer (adhesive layer) 11 is preferably 0.5 nm or more. Moreover, although it depends on the entire thickness of the recording film 3 and the entire structure of the memory cell MC1, the thickness of the first base layer (adhesive layer) 11 is preferably set to 2 nm or less so as not to interfere with an electric current passed so as to vertically penetrate the recording film 3.

Figure 4:
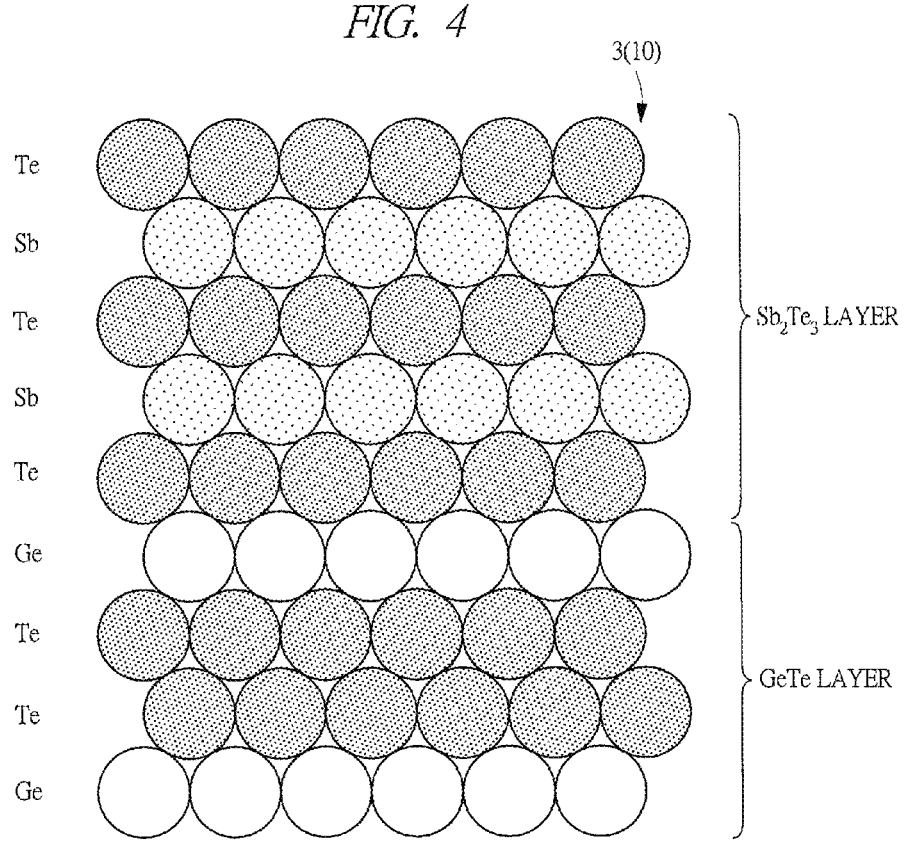
FIG. 4 is a diagram schematically showing a crystal structure of the recording film in its low resistance state.
Figure 5:
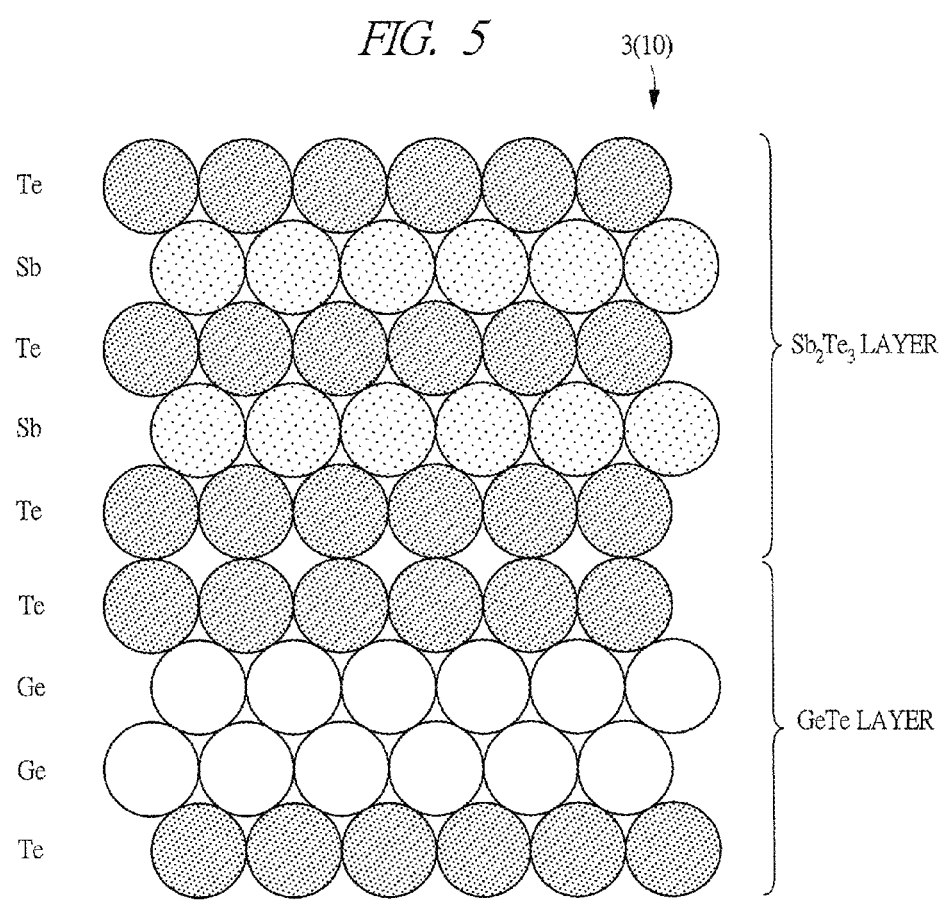
FIG. 5 is a diagram schematically showing a crystal structure of the recording film in its high resistance state.

Next, the change in the crystal structure of the recording film 3 at the time when the electric resistance of the recording film 3 having a super lattice structure is changed between a low resistance state and a high resistance state will be described. FIG. 4 is a drawing schematically showing the crystal structure of the recording film 3 in the low resistance state, and FIG. 5 is a drawing schematically showing a crystal structure of the recording film 3 in the high resistance state. FIGS. 4 and 5 show only one of the first crystal layers 13 and only one of the second crystal layers 14 that are vertically adjacent to each other in the cross-sectional structure of the stacked layer portion 10. Moreover, the example in which the first crystal layer 13 is a GeTe layer and the second crystal layer 14 is a $Sb_2Te_3$ layer will be described below.

When the electric resistance of the recording film 3 is in the low resistance state (state shown in FIG. 4), the stacking surface of the first crystal layer (GeTe layer) 13 is (111)-oriented in the cubic crystal, and the stacking surface of the second crystal layer ($Sb_2Te_3$ layer) 14 is (001)-oriented, that is, c-axis oriented in the hexagonal crystal. Since the first crystal layer (GeTe layer) 13 has a NaCl-type crystal structure and the NaCl-type crystal structure has a face-centered cubic lattice, the cubic crystal (111) plane of the first crystal layer 13 forms a close-packed plane. Moreover, since the second crystal layer ($Sb_2Te_3$ layer) 14 has a hexagonal crystal structure, and the (001) plane, that is, the c-plane of the hexagonal crystal is a close-packed plane. Therefore, both of the first crystal layer 13 and the second crystal layer 14 have a structure in which close-packed planes are stacked. The arrangement of each atomic layer of the first crystal layer 13 and the second crystal layer 14, that is, the atomic arrangement thereof is represented as Te—Sb—Te—Sb—Te—Ge—Te—Te—Ge from top to bottom as shown in FIG. 4. Moreover, the illustration of the crystal structure is simplified and drawn two-dimensionally in FIG. 4 for easy understanding, but a Ge atom of the first crystal layer (GeTe layer) 13 has 6-coordinate bonds with Te atoms located on the upper and lower positions.

On the other hand, also when the electric resistance of the recording film 3 is in the high resistance state (state shown in FIG. 5), the stacking surface of the second crystal layer ($Sb_2Te_3$ layer) 14 is (001)-oriented, that is, c-axis oriented in the hexagonal crystal, and both of the first crystal layer 13 and the second crystal layer 14 have a structure in which close-packed planes are stacked. However, the arrangement of each atomic layer of the first crystal layer 13 and the second crystal layer 14, that is, the atomic arrangement thereof is represented as Te—Sb—Te—Sb—Te—Te—Ge—Ge—Te from top to bottom as shown in FIG. 5. Moreover, the illustration of the crystal structure is simplified and drawn two-dimensionally in FIG. 5 for easy understanding, but a Ge atom of the first crystal layer (GeTe layer) 13 has 4-coordinate bonds with Te atoms located on the upper and lower positions.

When changing the recording film 3 in the low resistance state to the recording film 3 in a high resistance state (resetting operation), a thermal energy is applied to the recording film 3 by passing an electric current (programming current for resetting operation) through the recording film 3, so that Ge atoms are moved in a direction vertical to the stacking surface, thereby changing the atomic arrangement or the atomic position of the recording film 3 from the state shown in FIG. 4 to the state shown in FIG. 5. The structure in the high resistance state shown in FIG. 5 is not a so-called amorphous structure, that is, a structure in which the atomic arrangement is randomly made without a long-distance order, but a structure having a regular arrangement provided with an order that is close to a crystal structure.

In the general phase change memory, a recording film in a crystalline state is melted by passing an electric current to apply energy thereto, and the recording film with a random atomic arrangement is then rapidly cooled to obtain an amorphous state (non-crystalline state), thereby changing the resistance state of the recording film from the low resistance state to the high resistance state. In this case, the term "phase change" means that the structure of the recording film is changed between the crystalline state and the amorphous state (non-crystalline state).

On the other hand, in the phase change memory of the semiconductor memory device of the present embodiment, the recording film 3 has a super lattice structure in which the first crystal layers 13 made of, for example, GeTe and the second crystal layers 14 made of, for example, $Sb_2Te_3$ are alternately stacked repeatedly. Moreover, Ge atoms existing at the interface with the second crystal layer 14 out of Ge atoms contained in the first crystal layer 13 are moved in a direction perpendicular to the stacking surface so as to change the bonding state of the Ge atom to adjacent atoms, thereby changing the resistance state of the recording film 3 from the low resistance state to the high resistance state. According to this semiconductor memory device, since the recording film 3 can be easily changed between the low resistance state and the high resistance state even if energy to be applied to the recording film 3 is comparatively small, it is possible to carry out a writing operation (programming operation) at a low power.

In the present specification, even in the case of the change from a crystalline state to a structure having a regular arrangement provided with a certain order, the change in the atomic arrangement or atomic position between the low resistance state and the high resistance state is referred to as "phase-change" in the broad sense.

Next, an example of the manufacturing process of the semiconductor memory device of the present embodiment will be described. FIGS. 6 to 14 are cross-sectional views showing the semiconductor memory device of the first embodiment in the manufacturing process. Note that FIGS. 6 to 14 show only a portion corresponding to one memory cell MC1 described with reference to FIG. 1 in the semiconductor substrate 1.

Figure 6:
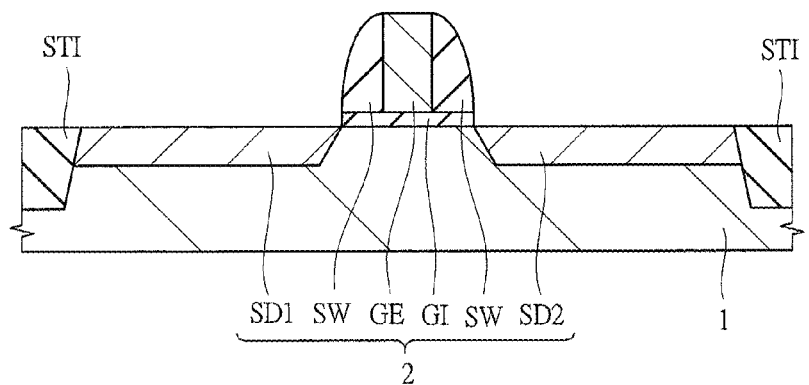
FIG. 6 is a cross-sectional view showing the semiconductor memory device of the first embodiment in a manufacturing process.

First, as shown in FIG. 6, a semiconductor substrate 1 on the main surface of which an MISFET 2 has been formed is prepared. For example, the semiconductor substrate 1 made of, for example, single crystalline silicon is prepared, and element isolation layers STI are formed in the main surface of the semiconductor substrate 1 by using, for example, an STI (Shallow Trench Isolation) method or the like. Next, on the main surface of the semiconductor substrate 1, for example, a silicon oxide film and a polycrystalline silicon (polysilicon) film are deposited, and are then patterned by using a photolithography technique and a dry etching technique, thereby forming a gate insulating film GI and a gate electrode GE. Next, on the main surface of the semiconductor substrate 1, for example, a silicon oxide film is deposited, and is then anisotropically etched, thereby forming sidewall spacers SW on the sidewalls of the gate electrode GE. Then, by carrying out an ion implantation and a heating treatment, diffusion layers serving as a drain SD1 and a source SD2 are formed in the portions of the main surface of the semiconductor substrate 1 on the both sides of the gate electrode GE. In this manner, the MISFET 2 is formed on the main surface of the semiconductor substrate 1.

Figure 7:
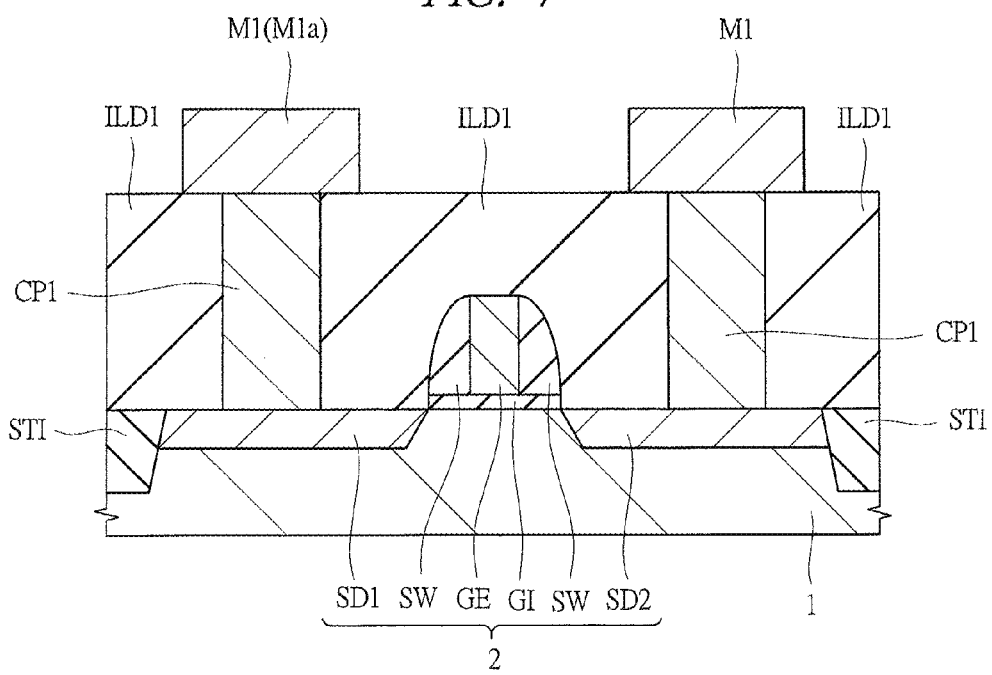
FIG. 7 is a cross-sectional view showing the semiconductor memory device of the first embodiment in the manufacturing process.

Next, on the semiconductor substrate 1, an interlayer insulating film ILD1 made of, for example, silicon oxide is deposited by using a CVD (Chemical Vapor Deposition) method or the like. Then, after the surface of the deposited interlayer insulating film ILD1 is flattened by using a CMP (Chemical Mechanical Polishing) method or the like, contact holes are formed in the interlayer insulating film ILD1 by using the photolithography technique and dry etching technique so that part of the semiconductor substrate 1 (the drain SD1 and source SD2 of the MISFET 2) and part (not shown in the drawings) of the gate electrode GE of the MISFET 2 are exposed. Subsequently, after a metal film made of, for example, W or the like is deposited on the semiconductor substrate 1 by a sputtering method, a CVD method, or the like so as to bury the contact holes thus formed, the metal film is polished by the CMP method or the like so that the deposited metal film is left only inside the contact holes, thereby forming contact plugs CP1 penetrating the interlayer insulating film ILD1. Then, after a metal film made of, for example, W or the like is deposited on the semiconductor substrate 1 by a sputtering method, a CVD method or the like, the metal film is patterned by using the photolithography technique and dry etching technique, thereby forming wires M1 as shown in FIG. 7. The wire M1 is electrically connected to the drain SD1 or the source SD2 of the MISFET 2 through the contact plug CP1, and a wire M1a of the wires M1 is electrically connected to the drain SD1 through the contact plug CP1. Moreover, although not shown in the drawings, some of the wires M1 are electrically connected to the gate electrode GE of the MISFET 2 through the contact plug (not shown) and are also electrically connected to the word line WL (not shown).

Figure 8:
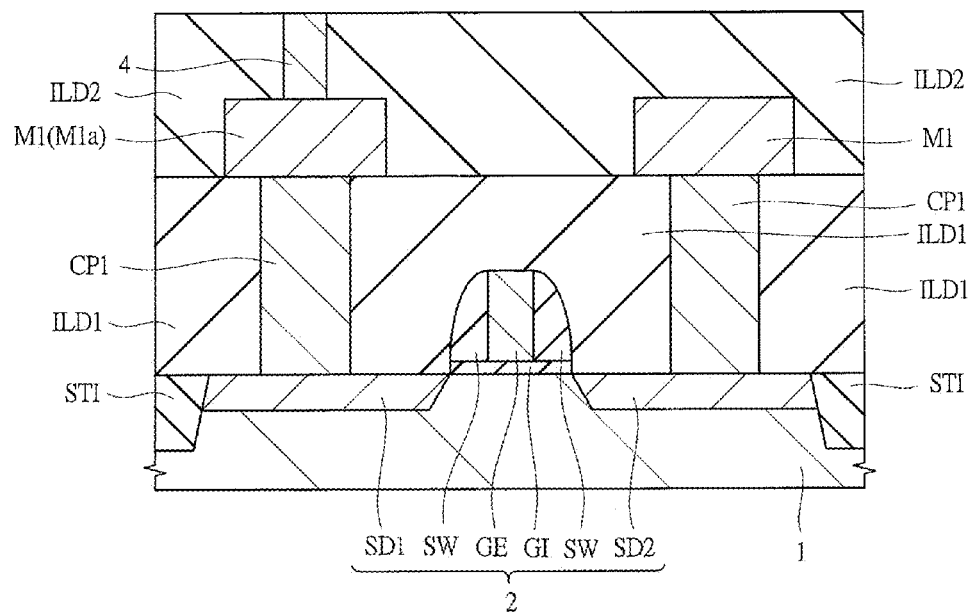
FIG. 8 is a cross-sectional view showing the semiconductor memory device of the first embodiment in the manufacturing process.

Next, on the semiconductor substrate 1, an interlayer insulating film ILD2 made of, for example, silicon oxide is deposited by using the CVD method or the like, and after the surface of the deposited interlayer insulating film ILD2 is flattened by the CMP method or the like, a contact hole is formed in the interlayer insulating film ILD2 by using the photolithography technique and dry etching technique so that part of the wire M1 is exposed. Subsequently, after a conductive film made of, for example, W or the like is deposited on the semiconductor substrate 1 by the sputtering method, the CVD method, or the like so as to bury the contact hole thus formed, the conductive film is polished by the CMP method or the like so that the deposited conductive film is left only inside the contact hole, thereby forming a lower electrode 4 as shown in FIG. 8. The lower portion of the lower electrode 4 is electrically connected to the wire M1, and the upper portion of the lower electrode 4 is exposed on the surface of the interlayer insulating film ILD2.

Figure 9:
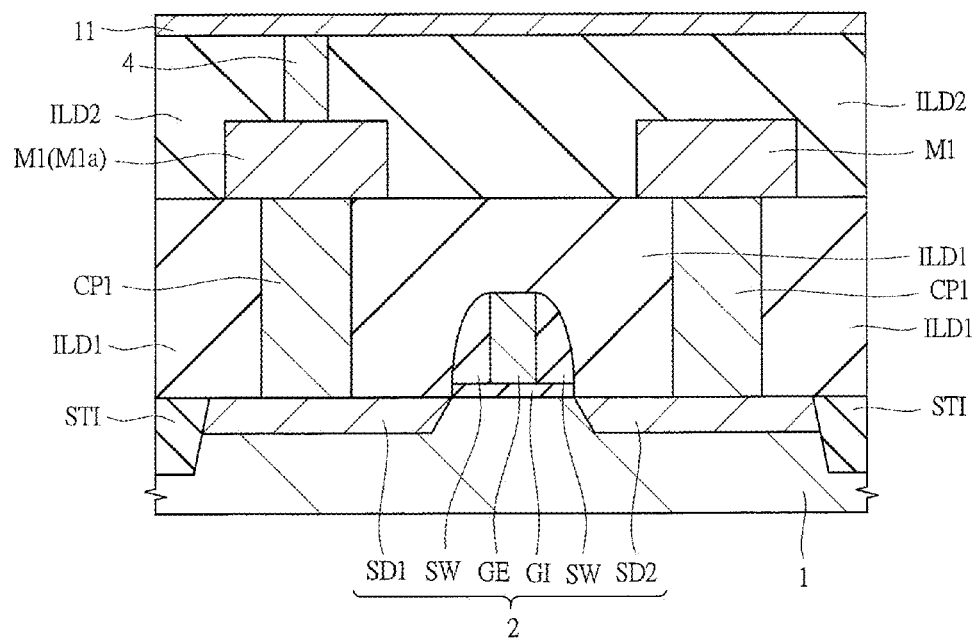
FIG. 9 is a cross-sectional view showing the semiconductor memory device of the first embodiment in the manufacturing process.

Next, as shown in FIG. 9, on the semiconductor substrate 1 on which the interlayer insulating film ILD2 and the lower electrode 4 have been formed, the first base layer (adhesive layer) 11 is formed. In the process for forming the first base layer 11, the first base layer 11 made of a nitride or an oxide of a transition metal such as TiN or the like is formed by the sputtering method, the CVD method or the like so as to have a thickness of 0.5 nm or more to 2 nm or less.

Figure 10:
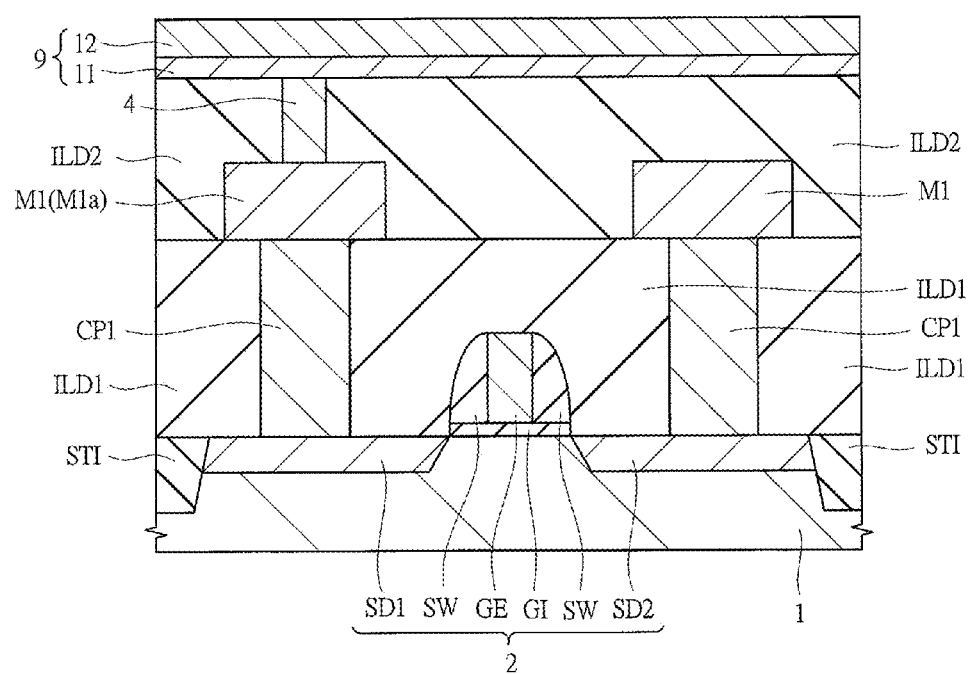
FIG. 10 is a cross-sectional view showing the semiconductor memory device of the first embodiment in the manufacturing process.

Next, as shown in FIG. 10, on the semiconductor substrate 1 on which the first base layer 11 has been formed, a second base layer (orientation layer) 12 is formed. In the process for forming the second base layer 12, the second base layer 12 made of a material having a hexagonal crystal structure such as Sb, $Sb_2Te_3$, $Bi_2Te_3$, or the like is formed by the sputtering method, the CVD method or the like so as to have a thickness of, for example, 1.0 nm or more to 10 nm or less. As a result, on the semiconductor substrate 1, a base portion 9 composed of the first base layer 11 and the second base layer 12 is formed. Moreover, in the case where the second base layer 12 is made of a material having the hexagonal crystal structure, the second base layer 12 is preferably (001)-oriented (c-axis oriented) as described above.

Moreover, preferably, the second base layer 12 is formed while heating the semiconductor substrate 1 to a temperature from 100° C. or more to 400° C. or less. In the case where the temperature of the semiconductor substrate 1 is less than 100° C., the second base layer 12 is not crystallized, or the second base layer 12 itself is hardly (001)-oriented (c-axis oriented). Moreover, in the case where the temperature of the semiconductor substrate 1 exceeds 400° C., there is the possibility that the second base layer 12 might be sublimated.

Figure 11:
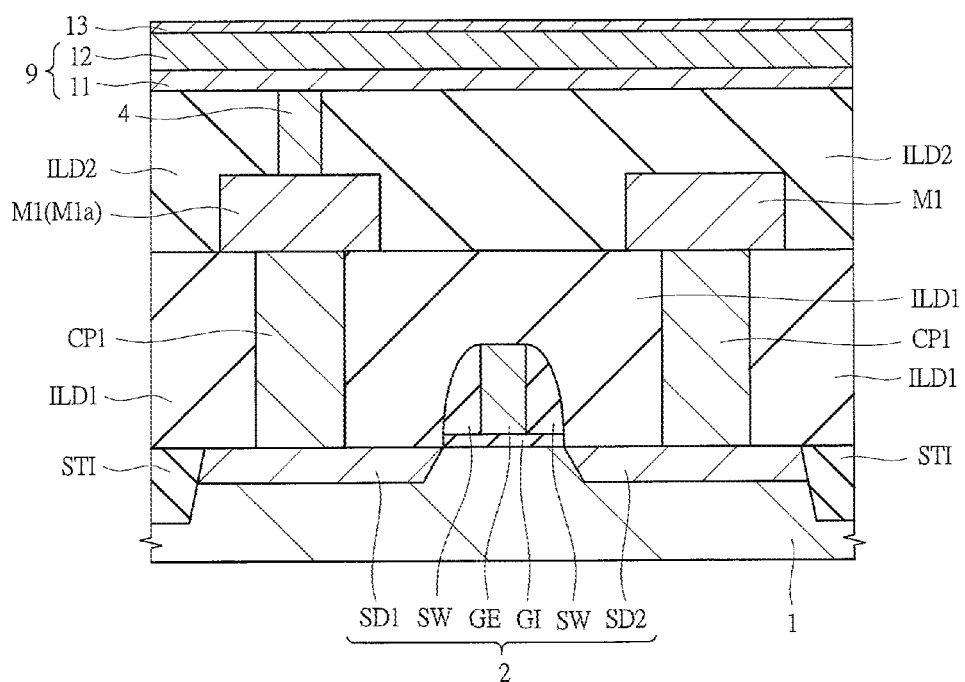
FIG. 11 is a cross-sectional view showing the semiconductor memory device of the first embodiment in the manufacturing process.

Next, as shown in FIG. 11, the first crystal layer 13 is formed on the semiconductor substrate 1 on which the second base layer 12 has been formed. In the process for forming the first crystal layer 13, for example, the first crystal layer 13 made of a chalcogen compound (first chalcogen compound) such as GeTe or the like is formed by the sputtering method, the CVD method or the like so as to have a thickness of, for example, 0.33 nm or more to 2.0 nm or less. As described above, the first chalcogen compound is preferably a chalcogen compound containing Ge, Sn or Mn and having a NaCl-type crystal structure (cubic crystal) in its low resistance state, and the first crystal layer 13 is (111)-oriented.

Figure 12:
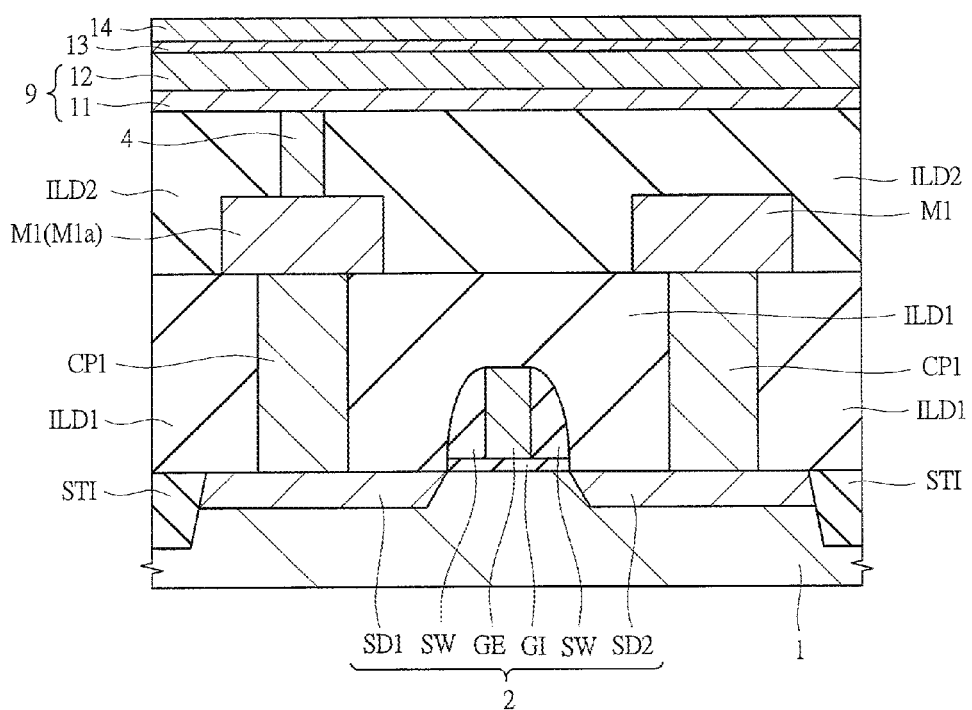
FIG. 12 is a cross-sectional view showing the semiconductor memory device of the first embodiment in the manufacturing process.

Next, as shown in FIG. 12, the second crystal layer 14 is formed on the semiconductor substrate 1 on which the first crystal layer 13 has been formed. In the process for forming the second crystal layer 14, for example, the second crystal layer 14 made of a chalcogen compound (second chalcogen compound) such as $Sb_2Te_3$, $Bi_2Te_3$, $HfTe_2$, $Cu_2Te$, SnTe or the like or Sb is formed by the sputtering method, the CVD method or the like so as to have a thickness of, for example, 1.0 nm or more to 10 nm or less. As described above, the second chalcogen compound is preferably a chalcogen compound having a hexagonal crystal structure, and the second crystal layer 14 is (001)-oriented (c-axis oriented). Moreover, Sb also has a hexagonal crystal structure and is (001)-oriented (c-axis oriented).

Figure 13:
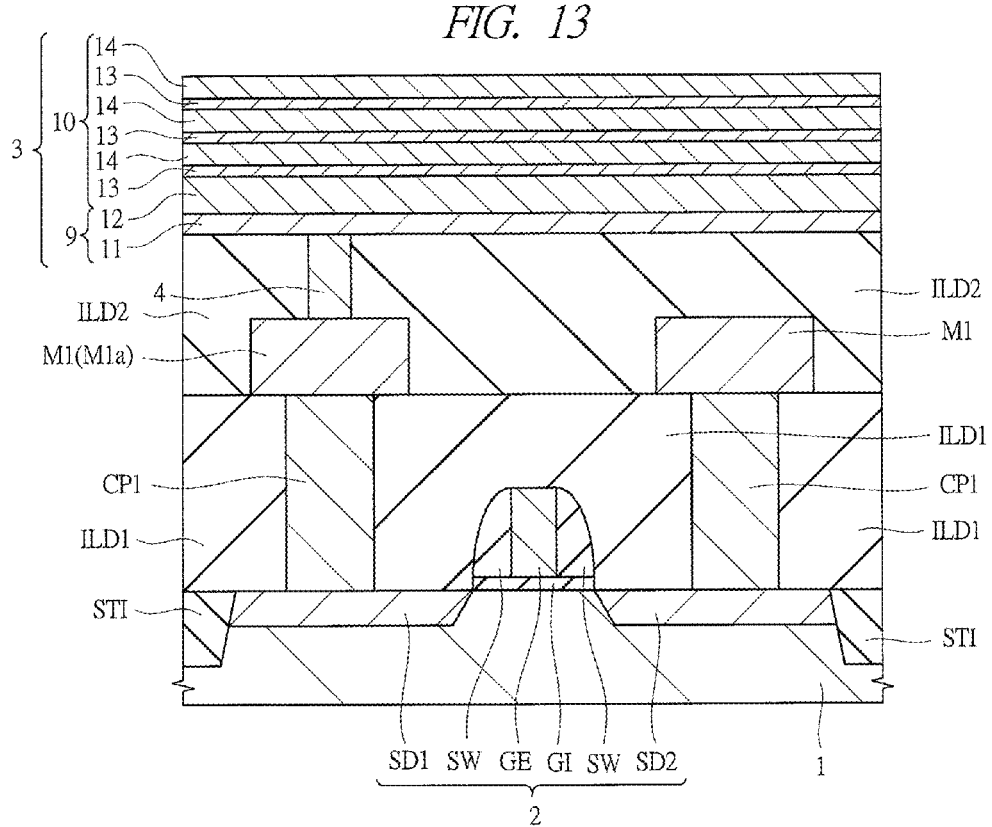
FIG. 13 is a cross-sectional view showing the semiconductor memory device of the first embodiment in the manufacturing process.

Thereafter, the process for forming the first crystal layer 13 and the process for forming the second crystal layer 14 are alternately carried out repeatedly, thereby forming the stacked layer portion 10 in which the first crystal layers 13 and the second crystal layers 14 are alternately stacked repeatedly as shown in FIG. 13. As described above, the stacking surface of the first crystal layers 13 is (111)-oriented, and the stacking surface of the second crystal layers 14 is (001)-oriented (c-axis oriented).

In the present embodiment, the process for forming the first base layer 11, the process for forming the second base layer 12, the process for forming the first crystal layer 13 and the process for forming the second crystal layer 14 are preferably carried out successively in a chamber of the same film-forming apparatus. In this manner, since the first base layer 11, the second base layer 12, the first crystal layer 13 and the second crystal layer 14 can be formed by the same film-forming method, the manufacturing process can be simplified.

Figure 14:
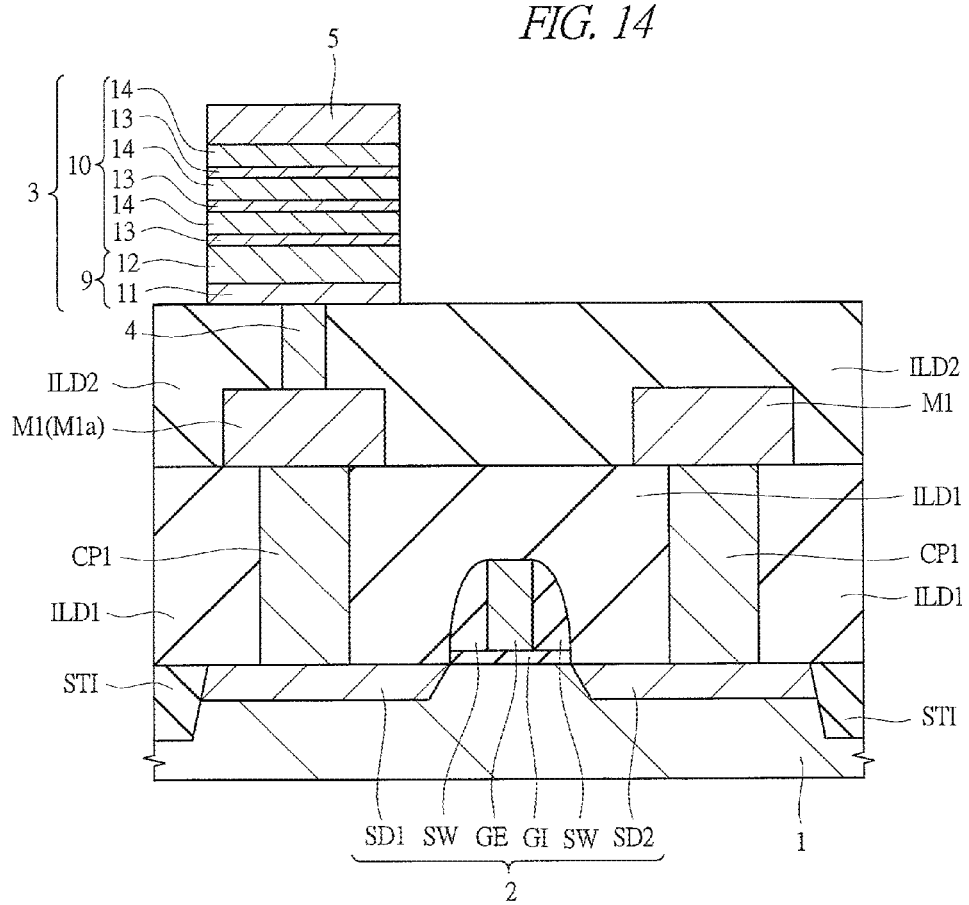
FIG. 14 is a cross-sectional view showing the semiconductor memory device of the first embodiment in the manufacturing process.

Next, after a conductive film made of, for example, W or the like is deposited by the sputtering method, the CVD method or the like on the semiconductor substrate 1 on which the stacked layer portion 10 has been formed, the conductive film is patterned by using the photolithography technique and dry etching technique, thereby forming the recording film 3 and the upper electrode 5 as shown in FIG. 14. At this time, the recording film 3 and the upper electrode 5 are separated for each of the memory cells MC1.

Thereafter, an interlayer insulating film ILD3 made of, for example, silicon oxide is deposited by the CVD method or the like on the semiconductor substrate 1 on which the recording film 3 and the upper electrode 5 have been formed, and after the surface of the deposited interlayer insulating film ILD3 is flattened by the CMP method or the like, a contact hole is formed in the interlayer insulating film ILD3 by using the photolithography technique and dry etching technique so that the upper electrode 5 is exposed. Subsequently, after a metal film made of, for example, W or the like is deposited on the semiconductor substrate 1 by the sputtering method, the CVD method, or the like so as to bury the contact hole thus formed, the deposited metal film is polished by the CMP method or the like so as to be left only inside the contact hole, thereby forming a contact plug CP2. The lower portion of the contact plug CP2 is electrically connected to the upper electrode 5, and the upper portion of the contact plug CP2 is exposed on the surface of the interlayer insulating film ILD3. Then, after a metal film made of, for example, W or the like is deposited by the sputtering method, the CVD method or the like on the semiconductor substrate 1 on which the interlayer insulating film ILD3 and the contact plug CP2 have been formed, the metal film is patterned by using the photolithography technique and dry etching technique, thereby forming a bit line BL. Through the process described above, the memory cell MC1 as shown in FIG. 1 is formed.

Next, the functions of the first base layer (adhesive layer) 11 for preventing the aggregation of the second base layer (orientation layer) 12 and improving the flatness of the surface of the second base layer (orientation layer) 12 will be described.

As described with reference to FIGS. 1 and 3, the second base layer (orientation layer) 12 improves the orientation of the stacked layer portion 10. More specifically, by the second base layer (orientation layer) 12, the stacking surface of the first crystal layer 13 is (111)-oriented, and the stacking surface of the second crystal layer 14 is (001)-oriented (c-axis oriented). For this reason, the second base layer (orientation layer) 12 has, for example, a hexagonal crystal structure and is (001)-oriented (c-axis oriented), and in order to achieve the orientation of the second base layer (orientation layer) 12 like this, it is effective to set the temperature of the substrate in forming the second base layer (orientation layer) 12 to, for example, a high temperature of 100° C. or more.

In the case where the second base layer (orientation layer) is formed on a substrate on which no first base layer (adhesive layer) has been formed, for example, a substrate whose surface is coated with silicon oxide, if the temperature of the substrate at the time of forming the second base layer (orientation layer) is high, the chalcogen compound is likely to be aggregated. For this reason, in the case where the film thickness of the second base layer (orientation layer) is small, the second base layer (orientation layer) is grown into an island pattern (in the form of islands), with the result that the flatness of the surface of the second base layer (orientation layer) is lowered. Moreover, when the film thickness of the second base layer (orientation layer) is large, the second base layer (orientation layer) is formed as a continuous film so as to cover the entire substrate instead of the island pattern (in the form of islands). However, on the surface of the second base layer (orientation layer), a concave/convex pattern caused by the growth into the island pattern (in the form of islands) in its initial stage of growth is left, with the result that the flatness of the surface of the second base layer (orientation layer) is lowered.

In the case where the flatness of the surface of the second base layer (orientation layer) is lowered in this manner, since the flatness and orientation of the stacking surface of the first crystal layer are lowered, it is not possible to align the directions in which the positions of constituent atoms are moved, with the result that an electric current required for a writing operation (programming operation) is increased and the performances of the semiconductor memory device are degraded. Moreover, when the flatness of the surface of the second base layer (orientation layer) is lowered, the flatness of the surface of the entire recording film is also lowered. Therefore, when dry etching is carried out so as to separate the recording film for each memory cell in the subsequent manufacturing process, for example, part of the recording film is left without being etched to degrade the processing precision, and the resistance value of the recording film varies in each of the memory cells, with the result that the performances of the semiconductor memory device might be degraded.

It may be thought that the above-mentioned aggregation of the second base layer (orientation layer) can be prevented and the flatness of the surface can be improved by lowering the temperature of the substrate in forming the second base layer (orientation layer). However, in the case where the temperature of the substrate in forming the second base layer (orientation layer) is lowered, although the flatness of the surface of the second base layer (orientation layer) is improved, the orientation of the second base layer (orientation layer) is lowered. When the orientation of the second base layer (orientation layer) is lowered, the orientation of the stacked layer portion to be formed on the second base layer (orientation layer) is also lowered.

As described above, in the case where the second base layer (orientation layer) and the stacked layer portion are formed on the substrate on which no first base layer (adhesive layer) is formed, it is difficult to satisfy both of the orientation and the surface flatness of the recording film.

In the present embodiment, as described above with reference to FIGS. 1 and 3, the first base layer (adhesive layer) 11 is formed as the base of the second base layer (orientation layer) 12. As described above, since a high adhesive property of the second base layer (orientation layer) 12 to the first base layer (adhesive layer) 11 can be obtained, the first base layer (adhesive layer) 11 makes it possible to prevent the aggregation of the second base layer (orientation layer) 12 and also to improve the flatness of the surface of the second base layer (orientation layer) 12. Accordingly, even when the temperature of the substrate in forming the second base layer (orientation layer) 12 is raised, the aggregation of the second base layer (orientation layer) 12 can be prevented and the flatness of the surface of the second base layer (orientation layer) 12 can be improved.

Thus, since the flatness and orientation of the stacking surface of the first crystal layer 13 are improved by improving the surface flatness of the second base layer (orientation layer) 12, it becomes possible to easily align the directions in which the positions of the constituent atoms are moved, and an electric current required for the writing operation (programming operation) can be reduced, so that the performances of the semiconductor memory device can be improved. Moreover, since the flatness of the entire surface of the recording film 3 is improved by improving the surface flatness of the second base layer (orientation layer) 12, when dry etching is carried out so as to separate the recording film 3 for each memory cell in the subsequent manufacturing process, it becomes possible to suppress the variations in the resistance value of the recording film 3 in each of the memory cells due to the degradation of the processing precision, and the performances of the semiconductor memory device can be improved.

In the following description, in order to evaluate the effects of the first base layer, a recording film composed of the first base layer, the second base layer, the first crystal layer and the second crystal layer is formed on a substrate. TiN is used as the material of the first base layer, $Sb_2Te_3$ is used as the material of the second base layer, GeTe is used as the chalcogen compound (first chalcogen compound) serving as a material of the first crystal layer, and $Sb_2Te_3$ is used as the chalcogen compound (second chalcogen compound) serving as a material of the second crystal layer. The helicon sputtering apparatus is used for forming the respective layers, and the recording film is formed by forming respective layers by the sputtering method using the targets having compositions corresponding to respective layers, that is, the respective targets of TiN, GeTe and $Sb_2Te_3$.

More specifically, a substrate the surface of which is covered with silicon oxide is prepared, the substrate thus prepared is placed in a film-forming chamber of the helicon sputtering apparatus, and then the inside of the film-forming chamber is vacuum-evacuated. Thereafter, an argon gas is introduced thereto so that the pressure inside the film-forming chamber is adjusted to 0.4 Pa, and the substrate is heated to the temperature of 250° C. Then, in a state where the above-mentioned pressure is maintained and the substrate is being heated, a high frequency power of 100 W is supplied to the TiN target, thereby forming a first base layer made of TiN with a film thickness of 1 nm on the substrate. Next, a high frequency power of 30 W is supplied to the $Sb_2Te_3$ target, thereby forming a second base layer made of $Sb_2Te_3$ with a film thickness of 10 nm on the substrate. Then, a high frequency power of 20 W is supplied to the GeTe target, thereby forming a first crystal layer made of GeTe with a film thickness of 1 nm on the substrate. Moreover, a high frequency power of 30 W is supplied to the $Sb_2Te_3$ target, thereby forming a second crystal layer made of $Sb_2Te_3$ with a film thickness of 1 nm on the substrate. Through the process described above, the recording film is formed.

Moreover, for use in comparison, another recording film is prepared separately by omitting the process for forming the first base layer and forming only the second base layer, the first crystal layer and the second crystal layer on the substrate.

Figure 15:
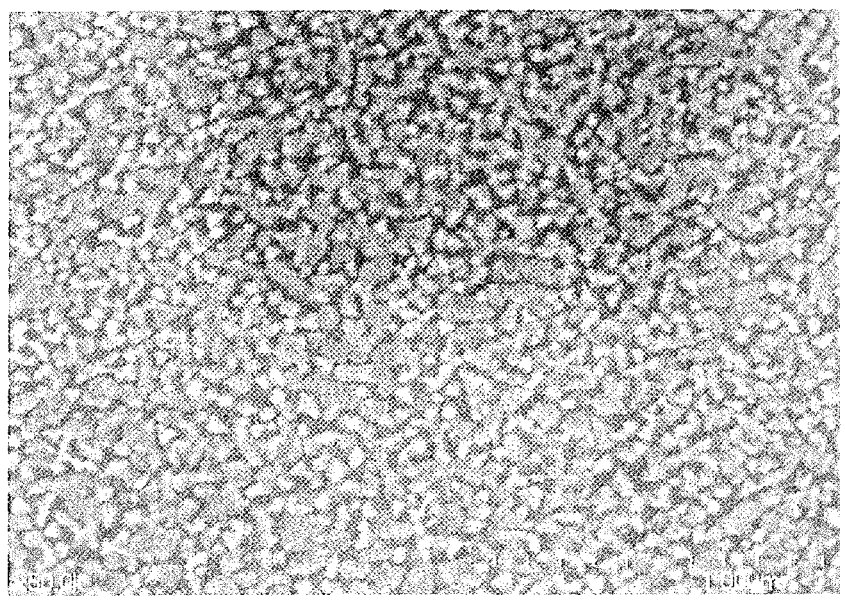
FIG. 15 is a photograph of the surface of the recording film in the case of forming no first base layer, taken by using a scanning electron microscope.
Figure 16:
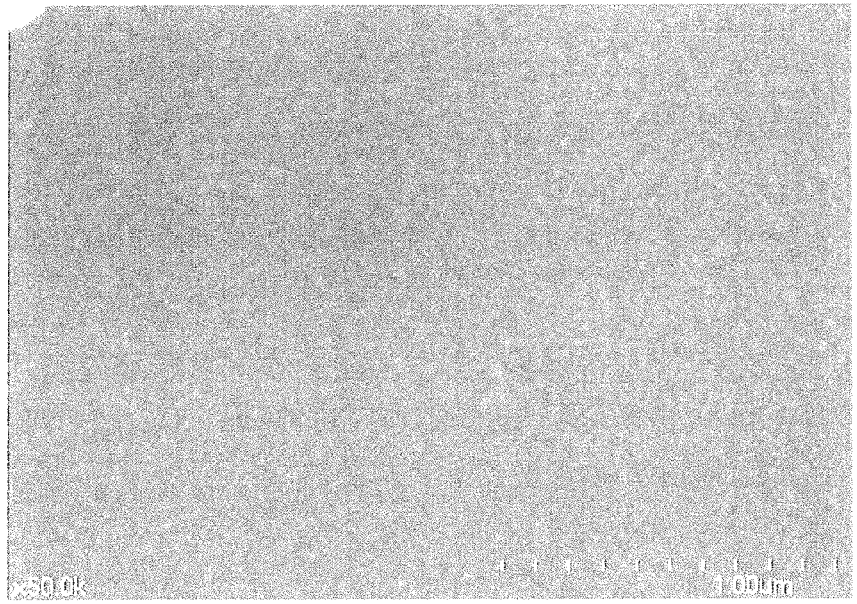
FIG. 16 is a photograph of the surface of the recording film in the case of forming the first base layer, taken by using a scanning electron microscope.

The flatness of the surface of the recording films thus formed is evaluated by using a scanning electron microscope (SEM) and an atomic force microscope (AFM). FIG. 15 shows a photograph of the surface of the recording film in the case of forming no first base layer, taken by using the scanning electron microscope. FIG. 16 shows a photograph of the surface of the recording film with the first base layer formed thereon, taken by using the scanning electron microscope.

As shown in FIG. 15, in the case where no first base layer is formed, the surface of the recording film thus formed has rough irregularities, and the flatness thereof is lowered. The surface roughness Ra measured by using the atomic force microscope is 5.46 nm, and it is a relatively large value.

In contrast, as shown in FIG. 16, in the case where the first base layer with a thickness of 1 nm is formed, the flatness of the surface of the recording film thus formed is improved. The surface roughness Ra measured by using the atomic force microscope is 0.57 nm, and it is a relatively small value. As can be seen, even when the temperature of the substrate in forming the second base layer is high so as to effectively improve the orientation of the second base layer, the aggregation of the second base layer can be prevented and the surface flatness of the second base layer and the recording film can be improved by forming the first base layer.

Moreover, the evaluation results in the case where the recording film is formed by forming the respective layers by the sputtering method have been shown above, but even when the respective layers are formed by using various film-forming methods such as a CVD method, an ALD (Atomic Layer Deposition) method, or the like, the same effects can be obtained.

Second Embodiment

Next, a semiconductor memory device according to the second embodiment of the present invention will be described. In the aforementioned first embodiment, the two electrodes, that is, the lower electrode and the upper electrode are formed on the upper and lower sides of the recording film. In contrast, in the second embodiment, two electrodes are formed on the lower side of the recording film.

Figure 17:
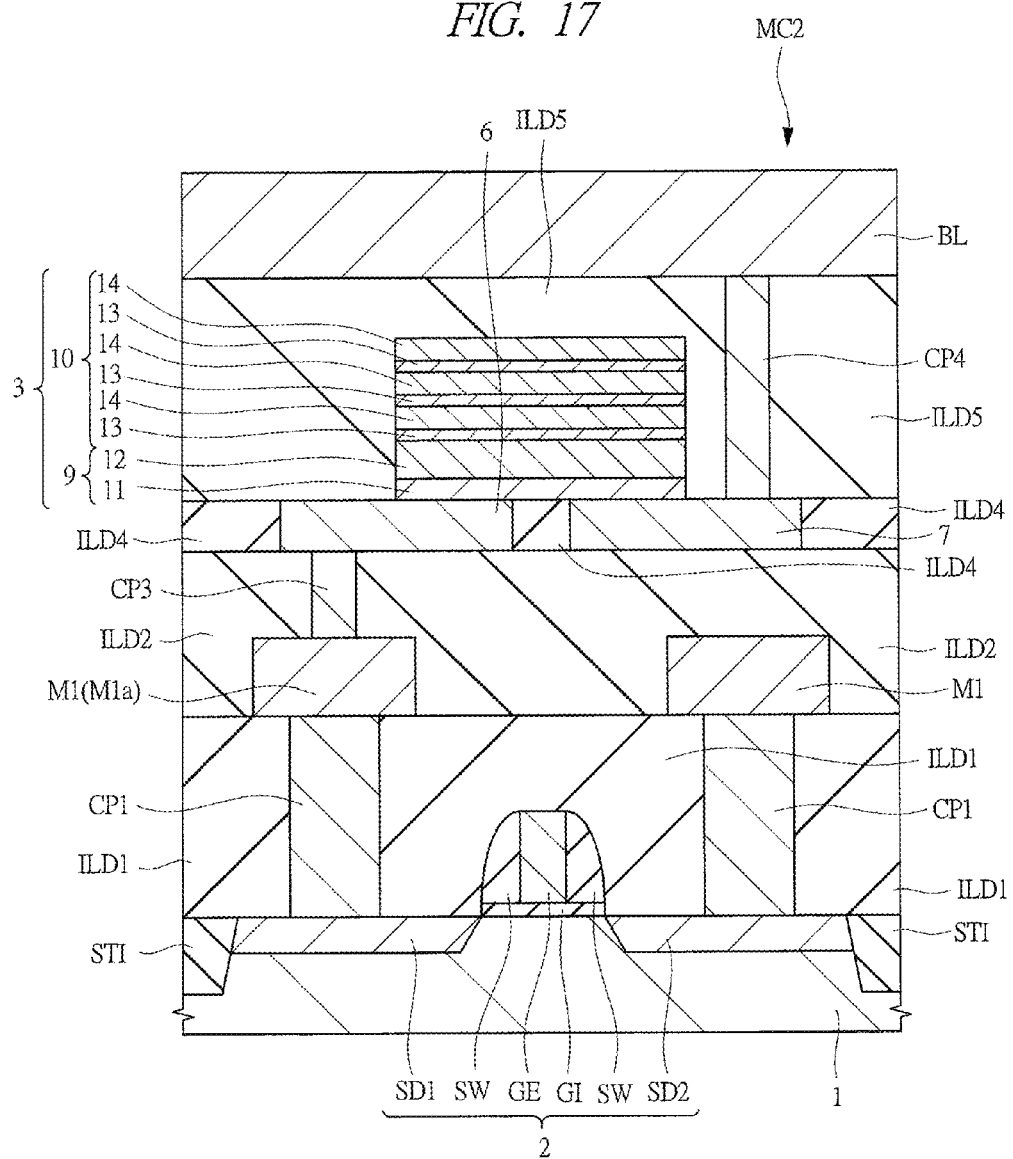
FIG. 17 is a cross-sectional view showing a principal part of a memory cell of a semiconductor memory device of the second embodiment.

FIG. 17 is a cross-sectional view showing a principal part of a memory cell MC2 of the semiconductor memory device of the second embodiment.

As shown in FIG. 17, like the memory cell MC1 of the first embodiment described with reference to FIG. 1, the memory cell MC2 of the present embodiment is also provided with an MISFET 2 serving as a selection transistor and formed on the semiconductor substrate 1 and a recording film 3 formed on the upper side of the MISFET 2 and having a super lattice structure. Moreover, although not shown in the drawings, the semiconductor memory device of the present embodiment also has a memory cell array including a plurality of memory cells MC2 disposed in regions at which each word line WL and each bit line BL intersect with each other like the structure of the memory cell array MA1 of the first embodiment described with reference to FIG. 2.

Moreover, like the recording film 3 of the first embodiment described with reference to FIG. 3, the recording film 3 of the semiconductor memory device of the present embodiment is also provided with a base portion 9 and a stacked layer portion 10 formed on the base portion 9. The base portion 9 has a structure in which a first base layer (adhesive layer) 11 and a second base layer (orientation layer) 12 are sequentially stacked, and the stacked layer portion 10 has a structure in which first crystal layers 13 made of a first chalcogen compound and second crystal layers 14 made of a second chalcogen compound having a composition different from that of the first chalcogen compound are alternately stacked repeatedly. Also in the present embodiment, the first base layer (adhesive layer) 11 prevents the aggregation of the second base layer (orientation layer) 12 and improves the flatness of the surface of the second base layer (orientation layer) 12 like in the first embodiment.

On the other hand, the semiconductor memory device of the present embodiment is provided with electrodes 6 and 7 that are separated from each other and formed so as to be in contact with a lower portion of the recording film 3. The recording film 3 has a structure bridging the electrodes 6 and 7 and is electrically connected to both of the electrodes 6 and 7.

On the interlayer insulating film ILD1, an interlayer insulating film ILD2 is formed so as to cover wires M1. In a part of the interlayer insulating film ILD2 on an upper side of the wire M1a electrically connected to the drain SD1, a contact plug CP3 made of, for example, W or the like is formed so as to penetrate the interlayer insulating film ILD2. A lower portion of the contact plug CP3 is electrically connected to the upper portion of the wire M1a.

An interlayer insulating film ILD4 is formed on the interlayer insulating film ILD2, and the electrodes 6 and 7 are formed in the interlayer insulating film ILD4 so as to penetrate the interlayer insulating film ILD4. A lower portion of the electrode 6 is electrically connected to an upper portion of the contact plug CP3. As described above, the upper portion of the electrode 6 is formed so as to be in contact with the lower portion of the recording film 3. Therefore, one end portion of the recording film 3 is electrically connected to the drain SD1 via the electrode 6, the contact plug CP3, the wire M1a and the contact plug CP1.

On the interlayer insulating film ILD4 and the electrodes 6 and 7, an interlayer insulating film ILD5 is formed so as to cover the recording film 3. In a part of the interlayer insulating film ILD5 on an upper side of the electrode 7, a contact plug CP4 is formed so as to penetrate the interlayer insulating film ILD5, and a lower portion of the contact plug CP4 is electrically connected to the upper portion of the electrode 7.

A bit line BL, made of, for example, W or the like is formed on the interlayer insulating film ILD5. A lower portion of the bit line BL is electrically connected to an upper portion of the contact plug CP4. Therefore, the other end portion of the recording film 3 is electrically connected to the bit line BL via the electrode 7 and the contact plug CP4.

Like the lower electrode 4 and the upper electrode 5 of the first embodiment, the electrodes 6 and 7 are composed of a conductive film made of metal or the like. As the specific material of the conductive film forming the electrodes 6 and 7, the materials of the conductive film forming the lower electrode 4 and the upper electrode 5 described in the first embodiment may be used.

Unlike the semiconductor memory device of the first embodiment, in the memory cell MC2 of the semiconductor memory device of the present embodiment, a programming current for resetting operation or a programming current for setting operation flows in a direction along the stacking surface of the first crystal layer 13 and the second crystal layer 14. However, even in the case where the electric current flows in the direction along the stacking surface of the first crystal layer 13 and the second crystal layer 14, since Joule heat is generated by the flow of the electric current and the atomic arrangement or the atomic position of the first crystal layer 13 is changed, the electric resistance of the recording film 3 can be changed between the low resistance state and the high resistance state.

Like the semiconductor memory device of the first embodiment, also in the memory cell MC2 of the semiconductor memory device of the present embodiment, a first base layer (adhesive layer) 11 is formed as the base of the second base layer (orientation layer) 12. Accordingly, even when the temperature of the substrate in forming the second base layer (orientation layer) 12 is high so as to effectively improve the orientation of the second base layer (orientation layer) 12, the aggregation of the second base layer (orientation layer) 12 can be prevented and the surface flatness of the second base layer (orientation layer) 12 can be improved. Thus, an electric current required for the writing operation (programming operation) can be reduced, it becomes possible to suppress the variations in the resistance value of the recording film 3 in each of the memory cells, and the performances of the semiconductor memory device can be improved.

Figure 18:
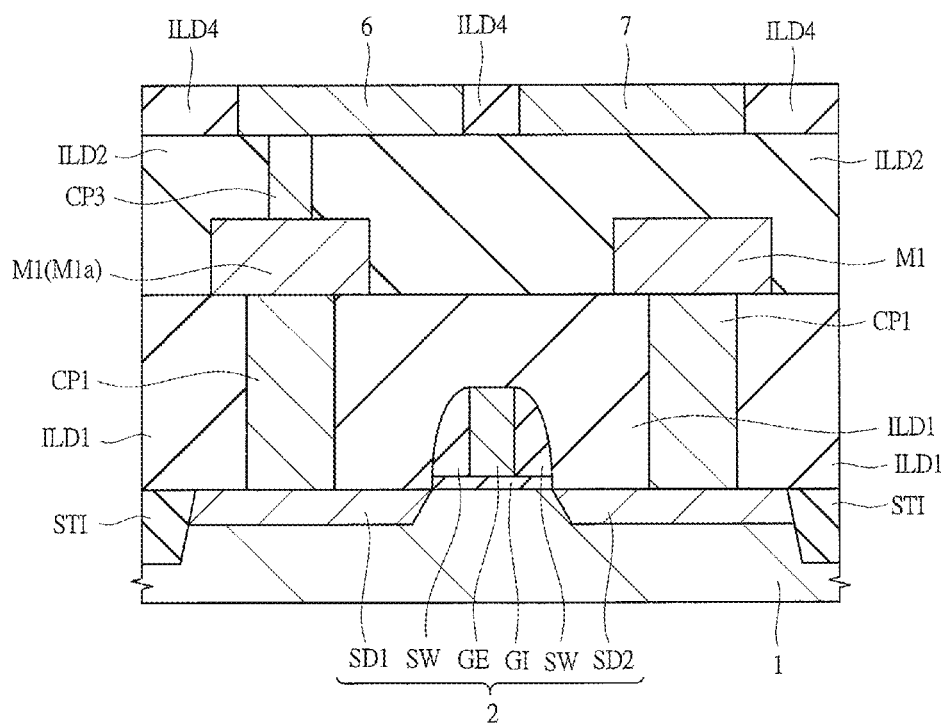
FIG. 18 is a cross-sectional view showing the semiconductor memory device of the second embodiment in a manufacturing process.
Figure 19:
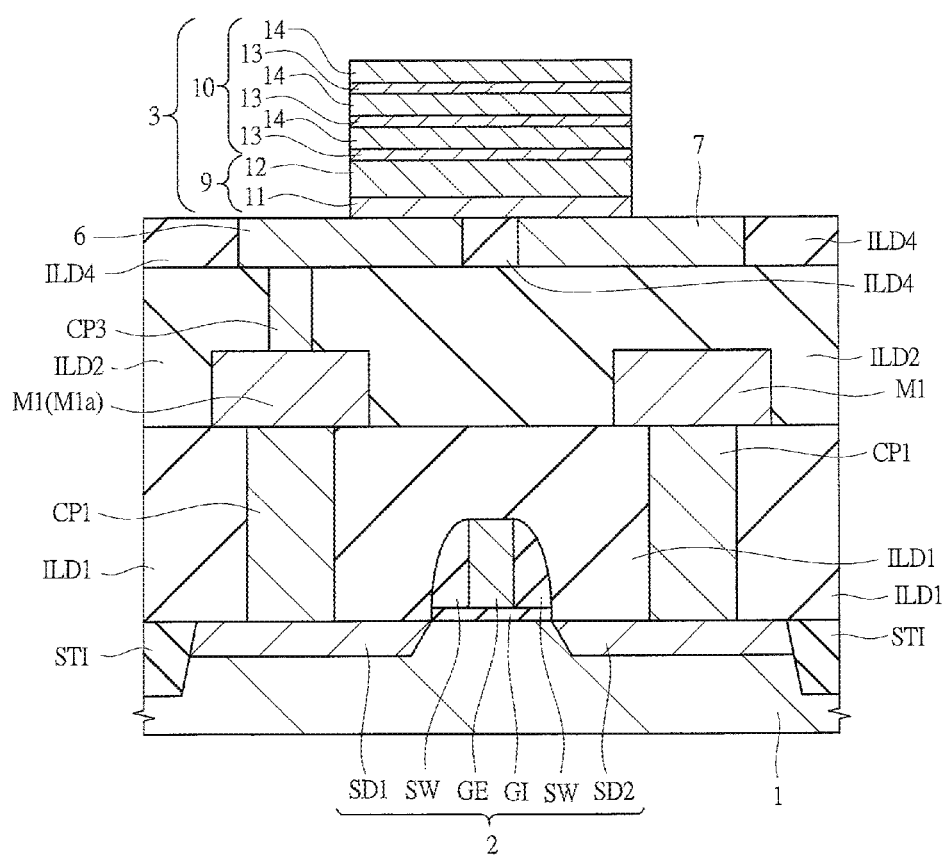
FIG. 19 is a cross-sectional view showing the semiconductor memory device of the second embodiment in the manufacturing process.

Next, an example of the manufacturing process of the semiconductor memory device of the present embodiment will be described. FIGS. 18 and 19 are cross-sectional views showing the semiconductor memory device of the second embodiment in the manufacturing process.

The manufacturing process of the semiconductor memory device of the second embodiment is the same as the manufacturing process of the semiconductor memory device of the first embodiment until the interlayer insulating film ILD2 is formed after the wire M1 is formed as described with reference to FIGS. 6 to 8. However, in second embodiment, in place of the lower electrode 4 (see FIG. 8) of the first embodiment, the contact plug CP3 (see FIG. 17) is formed so as to penetrate the interlayer insulating film ILD2.

Next, after the interlayer insulating film ILD4 made of, for example, silicon oxide is formed by the CVD method or the like on the semiconductor substrate 1 on which the interlayer insulating film ILD2 and the contact plug CP3 have been formed, openings through which the interlayer insulating film ILD2 and the contact plug CP3 are exposed are formed by the photolithography technique and dry etching technique in parts of the interlayer insulating film ILD4 where the electrodes 6 and 7 are to be formed. Subsequently, after a conductive film made of, for example, W or the like is deposited on the semiconductor substrate 1 by a sputtering method, a CVD method, or the like so as to bury the openings thus formed, the conductive film is polished by the CMP method or the like so that the deposited conductive film is left only inside the contact holes, thereby forming the electrodes 6 and 7 as shown in FIG. 18.

Next, by carrying out the same process as that described with reference to FIGS. 9 to 13 in the first embodiment, the first base layer 11 and the second base layer 12 are sequentially formed, and the first crystal layers 13 and the second crystal layers 14 are alternately stacked repeatedly. Thereafter, a patterning process is carried out by the photolithography technique and dry etching technique, thereby forming the recording film 3 as shown in FIG. 19.

Thereafter, on the semiconductor substrate 1 on which the recording film 3 has been formed, an interlayer insulating film ILD5 made of, for example, silicon oxide is deposited by the CVD method or the like, and after the surface of the deposited interlayer insulating film ILD5 is flattened by the CMP method or the like, a contact hole through which the electrode 7 is exposed is formed in the interlayer insulating film ILD5 by using the photolithography technique and dry etching technique. Subsequently, after a metal film made of, for example, W or the like is deposited on the semiconductor substrate 1 by the sputtering method, the CVD method, or the like so as to bury the contact hole thus formed, the deposited metal film is polished by the CMP method or the like so as to be left only inside the contact hole, thereby forming the contact plug CP4. Then, after a metal film made of, for example, W or the like is deposited on the semiconductor substrate 1 by the sputtering method, the CVD method or the like, the metal film is patterned by the photolithography technique and dry etching technique, thereby forming the bit line BL. Through the process described above, the memory cell MC2 show in FIG. 17 is formed.

Third Embodiment

Next, a semiconductor memory device according to the third embodiment of the present invention will be described. In the aforementioned first and second embodiments, the recording film is provided with a stacked layer portion in which the first crystal layers and the second crystal layers are stacked in a direction perpendicular to the main surface of the substrate. In contrast, in the third embodiment, the recording film is provided with a stacked layer portion in which the first crystal layers and the second crystal layers are stacked in a direction perpendicular to an inner wall surface of the hole (pore portion) formed in the substrate.

Figure 20:
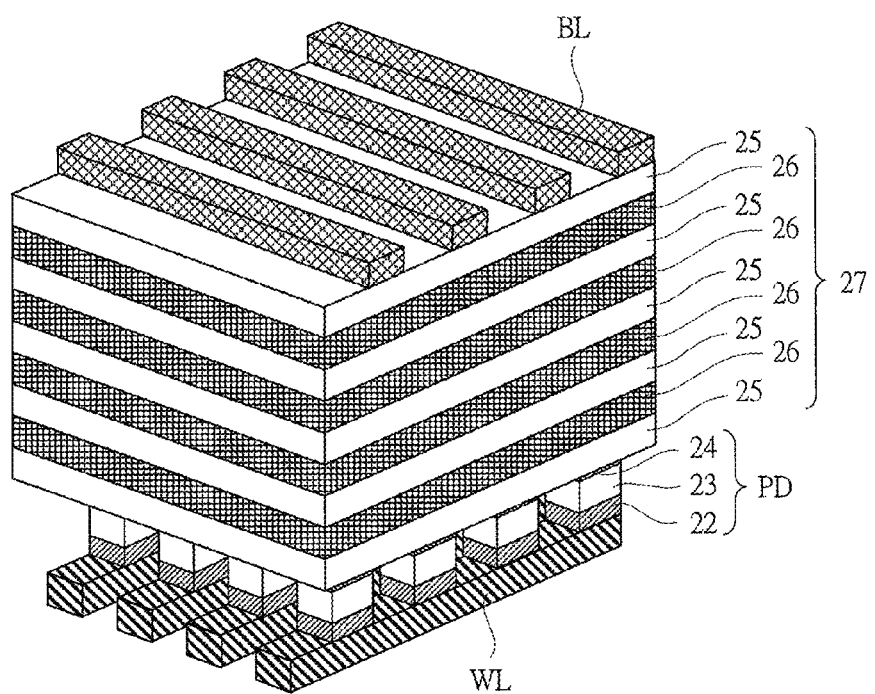
FIG. 20 is a perspective view showing a semiconductor memory device of the third embodiment.
Figure 21:
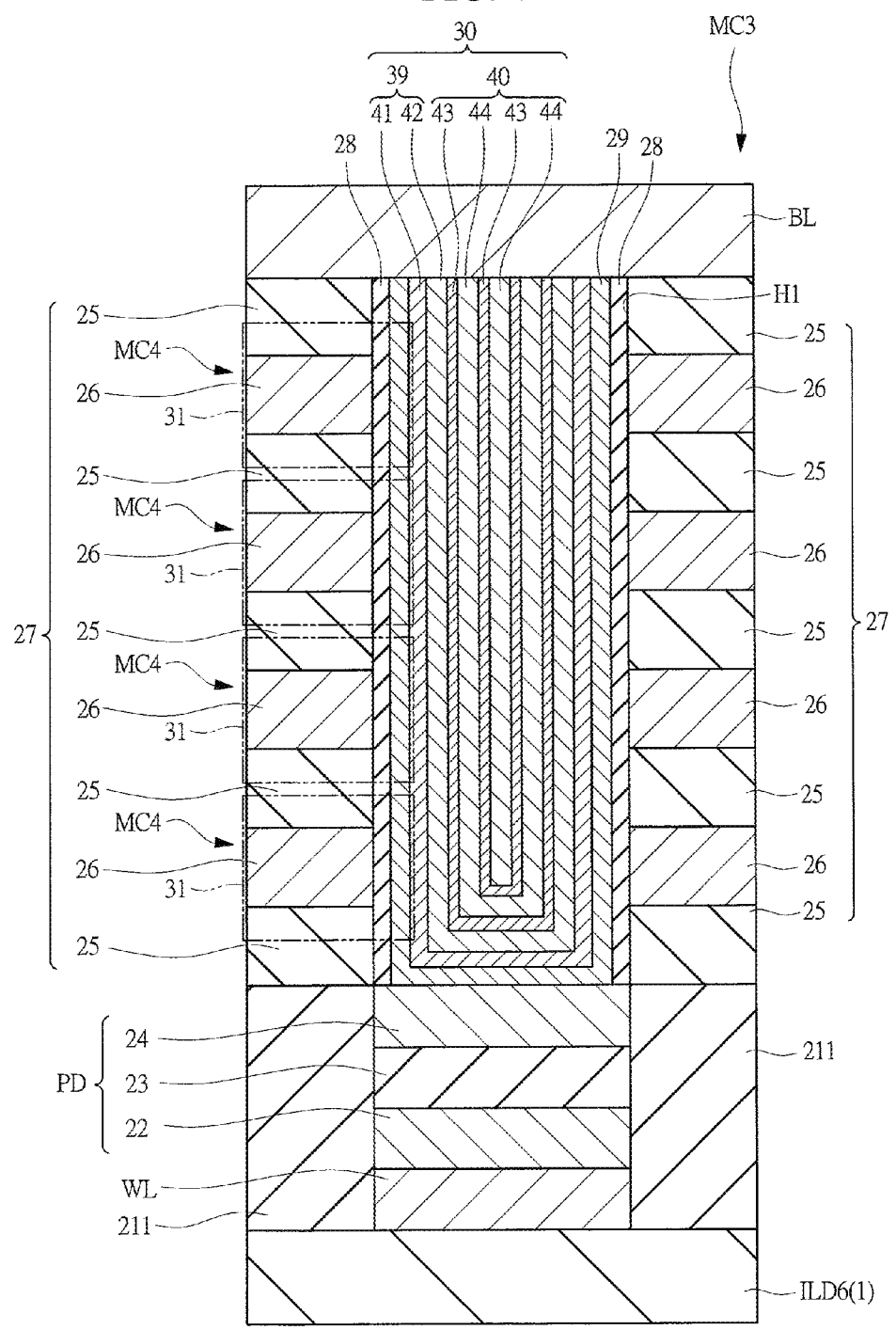
FIG. 21 is a cross-sectional view showing a principal part of a memory cell of a semiconductor memory device of the third embodiment.

FIG. 20 is a perspective view showing the semiconductor memory device of the third embodiment, and FIG. 21 is a cross-sectional view showing a principal part of a memory cell MC3 of the semiconductor memory device of the third embodiment. For convenience of viewing, illustrations of an interlayer insulating film ILD6 and an insulating layer 211 shown in FIG. 21 are omitted in FIG. 20.

As shown in FIG. 21, on the interlayer insulating film ILD6 made of, for example, silicon oxide and formed on the semiconductor substrate 1, the insulating layer 211 made of, for example, silicon oxide is formed. A word line WL and a columnar polysilicon diode PD are formed in the insulating layer 211 so as to penetrate the insulating layer 211. The word line WL is formed on the interlayer insulating film ILD6 and made of, for example, W or the like. Moreover, the polysilicon diode PD is composed of a polysilicon layer 22 doped with a p-type impurity, a polysilicon layer 23 doped with an impurity with a low concentration, and a polysilicon layer 24 doped with an n-type impurity, which are sequentially formed on the word line WL. Therefore, the lower portion of the polysilicon diode PD is electrically connected to the upper portion of the word line WL.

Incidentally, although the illustration of the lower portion of the interlayer insulating film ILD6 of the semiconductor substrate 1 is omitted in FIG. 21, an MISFET or the like for selecting the bit line BL may be further formed on the lower side of the interlayer insulating film ILD6 of the semiconductor substrate 1 via another interlayer insulating film.

A stacked body 27 in which insulating layers 25 and polysilicon layers 26 are alternately stacked is formed on the insulating layer 211 and the polysilicon diode PD. The insulating layers 25 and the polysilicon layers 26 are alternately stacked so that the insulating layers 25 form the lowermost portion (portion in contact with the insulating layer 211) and the uppermost portion of the stacked body 27. Each polysilicon layer 26 functions as a gate electrode of a selection transistor (vertical MISFET 31 to be described later) for selecting each phase change memory (memory cell MC4 to be described later).

A hole (pore portion) H1 is formed in the stacked body 27 so as to reach the upper surface of the polysilicon diode PD from the upper surface of the stacked body 27, that is, so as to penetrate the stacked body 27, and a gate insulating film 28 is formed in the hole H1 so as to cover the inner wall of the hole H1. In the hole H1 on which the gate insulating film 28 has been formed, a polysilicon layer 29 is formed so as to cover the inner wall and the bottom of the hole H1. Therefore, the upper portion of the polysilicon diode PD is electrically connected to the polysilicon layer 29. The polysilicon layer 29 functions as a source and a drain of a selection transistor (vertical MISFET 31 to be described later) for selecting each phase change memory (memory cell MC4 to be described later), in which each polysilicon layer 26 serves as the gate electrode.

In the hole H1 on which the polysilicon layer 29 has been formed, a recording film 30 is formed so as to cover the inner wall and the bottom of the hole H1 and bury the hole H1 from the bottom to the top.

On the hole H1 whose inner wall is covered with the gate insulating film 28 and the polysilicon layer 29 and whose inside is buried by the recording film 30 and on the stacked body 27, a bit line BL made of, for example, W or the like is formed. The polysilicon layer 29 is electrically connected to the bit line BL, and the bit line BL is further connected to other circuits.

The polysilicon layer 22 is a polycrystalline silicon film doped with a p-type impurity, and functions as a p-type layer of the polysilicon diode PD serving as a PIN diode. Moreover, the polysilicon layer 24 is a polycrystalline silicon film doped with an n-type impurity, and functions as an n-type layer of the polysilicon diode PD serving as the PIN diode.

The polysilicon layer 23 is a polycrystalline silicon film to which an impurity having a concentration lower than those of the polysilicon layers 22 and 24 is doped, has a higher resistance than those of the polysilicon layers 22 and 24, and functions as an I layer (Intrinsic layer, field relaxation layer) of the polysilicon diode PD serving as the PIN diode. The impurity introduced into the polysilicon layer 23 may be either a p-type impurity (for example, boron (B)) or an n-type impurity (for example, phosphorus (P)). Moreover, the polysilicon layer 23 may be an intrinsic semiconductor layer such as a non-doped silicon layer to which no impurity is introduced. Furthermore, the polysilicon layer 23 may be formed to have a two-layer stacked structure in which one layer contains an impurity and the other layer contains no impurity.

As the material of the polysilicon layer 23, preferably, a material that can be easily bonded to the polysilicon layers 22 and 24 may be used. More specifically, as the material of the polysilicon layer 23, preferably, a compound that contains silicon (Si) or a material that contains a group 14 semiconductor element similar to silicon (Si), for example, silicon (Si), germanium (Ge), silicon carbide (SiC), silicon germanium (SiGe), and others may be used.

The recording film 30 constitutes, together with the polysilicon layer 29, a path (current path) of an electric current flowing between the polysilicon diode PD and the bit line BL. The detailed structure and materials of the recording film 30 will be described later.

Figure 22:
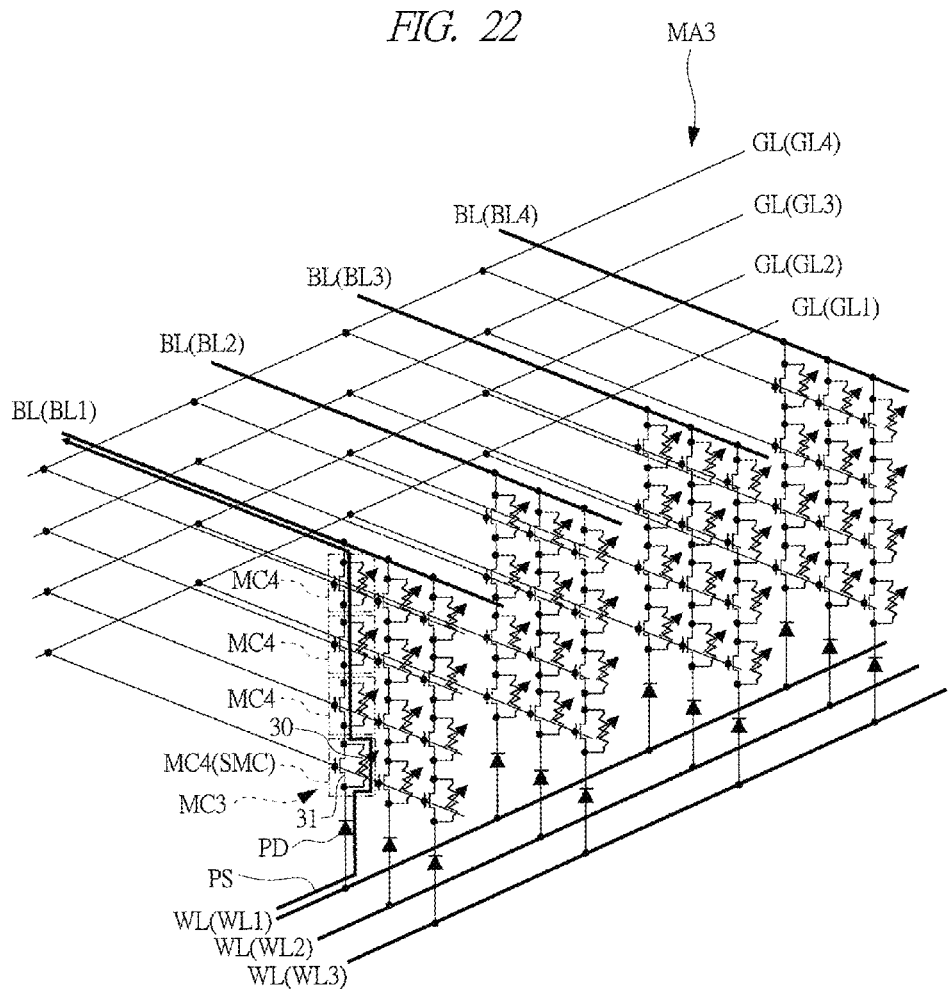
FIG. 22 is an equivalent circuit diagram showing an example of the configuration of a memory cell array of the semiconductor memory device of the third embodiment.

Next, an example of the configuration of a memory cell array MA3 of the semiconductor memory device will be described. FIG. 22 is an equivalent circuit diagram showing an example of the configuration of the memory cell array MA3 of the semiconductor memory device of the third embodiment.

As shown in FIG. 22, the semiconductor memory device of the present embodiment is provided with the memory cell array MA3 including a plurality of word lines WL (WL1 to WL3) that extend in a first direction, a plurality of bit lines BL (BL1 to BL4) that extend in a second direction intersecting the first direction, a plurality of gate lines GL (GL1 to GL4) that extend in the first direction, and a plurality of sets of memory cells MC3 disposed in the regions at which each word line WL and each bit line BL intersect with each other. As shown in FIG. 21, each memory cell MC3 is provided with the polysilicon diode PD, the plural polysilicon layers 26, the gate insulating films 28, the polysilicon layer 29 and the recording film 30. The polysilicon diode PD is electrically connected to the word line WL, the polysilicon layer 29 and the recording film 30 are electrically connected to the bit line BL, and the plural polysilicon layers 26 are electrically connected to the gate lines GL, respectively.

One polysilicon layer 26 and portions of the gate insulating films 28 and the polysilicon layer 29 that correspond to the polysilicon layer 26 constitute the vertical MISFETs 31 (see FIGS. 21 and 22). Moreover, one vertical MISFET 31 and a portion of the recording film 30 that corresponds to the vertical MISFET 31 constitute a memory cell MC4 (see FIGS. 21 and 22). Each vertical MISFET 31 functions as a selection transistor for selecting each memory cell MC4. Therefore, the memory cell MC3 has a memory cell chain structure in which four memory cells MC4 are connected in the longitudinal direction (direction perpendicular to the main surface of the semiconductor substrate 1).

Operations of the memory cell MC3 configured as described above are carried out in the following manner. First, for example, 0 V is applied to the gate line GL1 to which the selection cell SMC shown in FIG. 22, that is, the selected memory cell MC4 is connected, thereby bringing the vertical MISFET 31 of the selection cell SMC to an OFF state. On the other hand, 5 V is applied to the gate lines GL2, GL3 and GL4 to which no selection cell SMC is connected, thereby bringing the selection transistor of the memory cell MC4 connected to the gate lines GL2, GL3 and GL4 to an ON state. 0 V is applied to the bit line BL1, and 5 V, 4 V and 2 V are applied to the word line WL1 in a resetting operation, a setting operation and a reading operation, respectively. As a result, as indicated by the current path PS in FIG. 22, in the selection cell SMC of the plural memory cells MC4 constituting the memory cell MC3, an electric current flows through the recording film 30 because the selection transistor is in the OFF state, and in the memory cells other than the selection cell SMC of the plural memory cells MC4 constituting the memory cell MC3, an electric current flows through the polysilicon layer 29 because the selection transistor is in the ON state.

At the time of carrying out the resetting operation and the setting operation, by applying a thermal energy by the electric current flowing through the recording film 30 of the selection cell SMC, the atomic arrangement or the atomic position of the recording film 30 of the selection cell SMC is changed, thereby changing the resistance value of the recording film 30 of the selection cell SMC. On the other hand, at the time of carrying out the reading operation, the value of an electric current flowing through the recording film 30 of the selection cell SMC is determined.

Next, the detailed structure of the recording film 30 in the memory cell MC3 of the semiconductor memory device of the present embodiment will be described with reference to FIG. 21.

As shown in FIG. 21, the recording film 30 is provided with a base portion 39 and a stacked layer portion 40. The base portion 39 has a structure in which a first base layer (adhesive layer) 41 and a second base layer (orientation layer) 42 are sequentially stacked in the hole H1 so as to cover the inner wall of the hole H1 on which the polysilicon layer 29 has been formed. In this case, the first base layer (adhesive layer) 41 and the second base layer (orientation layer) 42 are formed so as to cover also the bottom of the hole H1. The stacked layer portion 40 has a structure in which first crystal layers 43 made of a first chalcogen compound and second crystal layers 44 made of a second chalcogen compound having a composition different from that of the first chalcogen compound are alternately stacked repeatedly in the hole H1 so as to cover the inner wall and the bottom of the hole H1 on which the base portion 39 has been formed. More specifically, the recording film 30 has the structure in which the first base layer (adhesive layer) 41, the second base layer (orientation layer) 42, and the stacked layer portion 40 including the alternately stacked first crystal layers 43 and second crystal layers 44 are stacked in this order from the inner wall side to the center side of the hole H1. Therefore, the first crystal layers 43 and the second crystal layers 44 are stacked in a direction perpendicular to the inner wall surface of the hole H1. Moreover, in the cross-sectional structure shown in FIG. 21, the recording film 30 is formed in a bilaterally symmetrical pattern with respect to the center of the hole H1 serving as the symmetry center. Also in the present embodiment, like the first embodiment, the second base layer (orientation layer) 42 has a function of enhancing the orientation of the stacked layer portion 40, and the first base layer (adhesive layer) 41 has a function of preventing the aggregation of the second base layer (orientation layer) 42 and improving the flatness of the surface of the second base layer (orientation layer) 42.

In the stacked layer portion 40, the first crystal layers 43 and the second crystal layers 44 are alternately formed repeatedly, and the stacked layer portion 40 has a super lattice structure. Note that, as the stacked layer portion 40, a structure in which one first crystal layer 43 and one second crystal layer 44 are stacked may be used in place of the structure in which the first crystal layers 43 and the second crystal layers 44 are alternately stacked repeatedly.

As materials of the respective layers of the first base layer 41, the second base layer 42, the first crystal layer 43 and the second crystal layer 44 in the present embodiment, the same materials as those of the first base layer 11, the second base layer 12, the first crystal layer 13 and the second crystal layer 14 in the first embodiment may be used. Moreover, preferable thicknesses of the respective layers of the first base layer 41, the second base layer 42, the first crystal layer 43 and the second crystal layer 44 and preferable orientation directions of the respective layers relative to the stacking surface of the stacked layer portion 40 are the same as those preferable thicknesses of the respective layers of the first base layer 11, the second base layer 12, the first crystal layer 13 and the second crystal layer 14 and those preferable orientation directions of the respective layers relative to the stacking surface of the stacked layer portion 10 in the first embodiment. However, the stacking surface of the stacked layer portion 40 in the present embodiment differs from that of the first embodiment in that it is not in parallel with the main surface of the semiconductor substrate 1, but in parallel with the inner wall surface of the hole H1.

Next, an example of the manufacturing process of the semiconductor memory device of the present embodiment will be described. FIGS. 23 to 30 and FIG. 38 are perspective views showing the semiconductor memory device of the present third embodiment in the manufacturing process. Moreover, FIGS. 31 to 37 are cross-sectional views showing the semiconductor memory device of the present third embodiment in the manufacturing process. Note that FIGS. 31 to 37 show only a portion corresponding to one memory cell MC3 described with reference to FIG. 21 in the semiconductor substrate 1.

Figure 23:
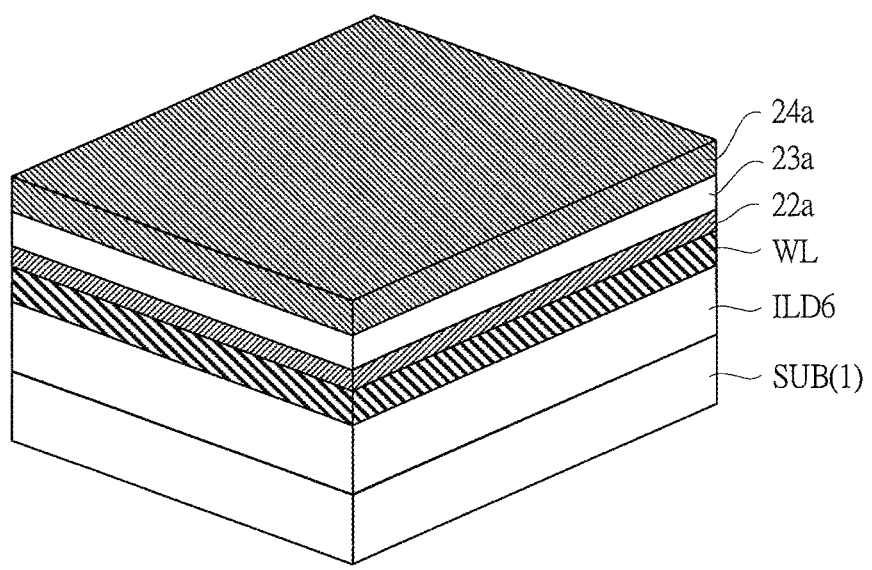
FIG. 23 is a perspective view showing the semiconductor memory device of the third embodiment in a manufacturing process.
Figure 24:
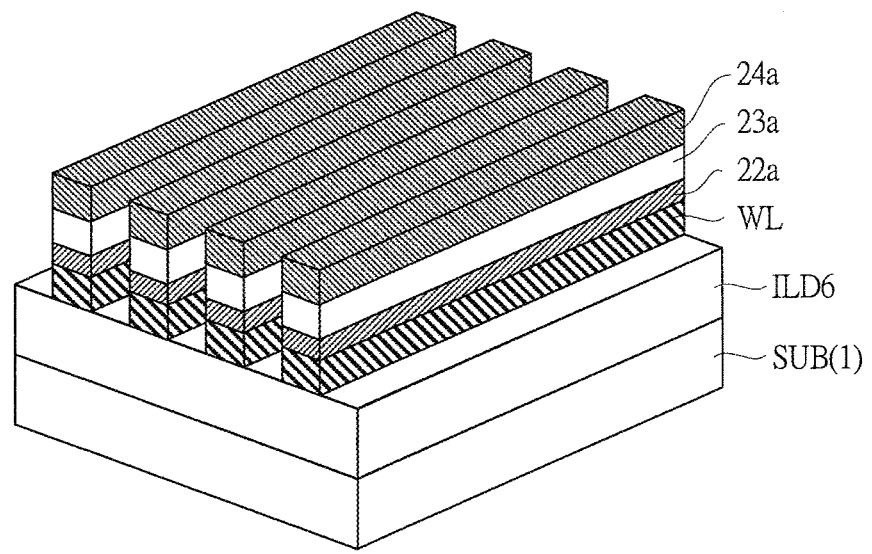
FIG. 24 is a perspective view showing the semiconductor memory device of the third embodiment in the manufacturing process.

First, a semiconductor substrate 1 on a main surface SUB of which an interlayer insulating film ILD6 made of, for example, silicon oxide has been formed by the CVD method or the like is prepared. Next, as shown in FIG. 23, on the semiconductor substrate 1, a tungsten (W) film to be a word line WL, an amorphous silicon layer 22*a* doped with a p-type impurity at a high concentration, an amorphous silicon layer 23*a* doped with no impurity, and an amorphous silicon layer 24*a* doped with an n-type impurity are sequentially formed by using, for example, the CVD method or the like. Then, when they are processed into a stripe pattern by using the photolithography technique and dry etching technique, the structure as shown in FIG. 24 is obtained. At this time, the tungsten (W) film processed into the stripe pattern forms the word line WL. Then, after the gaps between the respective amorphous silicon layers 22*a*, 23*a* and 24*a* processed into the stripe pattern and between the mutual word lines WL are buried with an insulating layer 211 made of, for example, silicon oxide, the surface thereof is flattened by the CMP method or the like, so that the structure shown in FIG. 25 is obtained.

Figure 25:
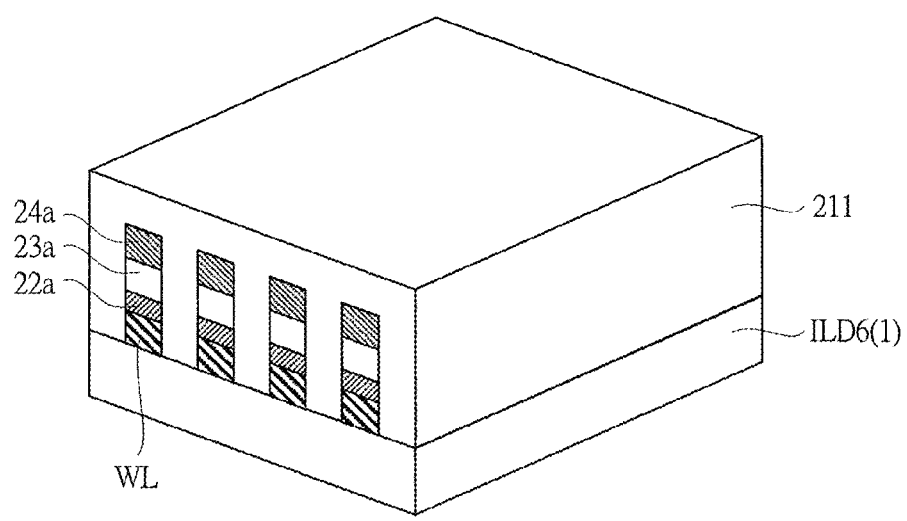
FIG. 25 is a perspective view showing the semiconductor memory device of the third embodiment in the manufacturing process.
Figure 26:
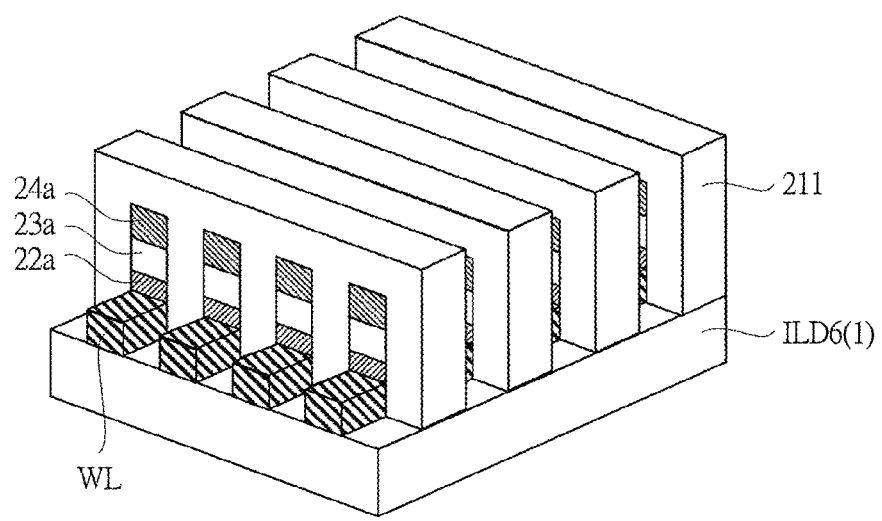
FIG. 26 is a perspective view showing the semiconductor memory device of the third embodiment in the manufacturing process.
Figure 27:
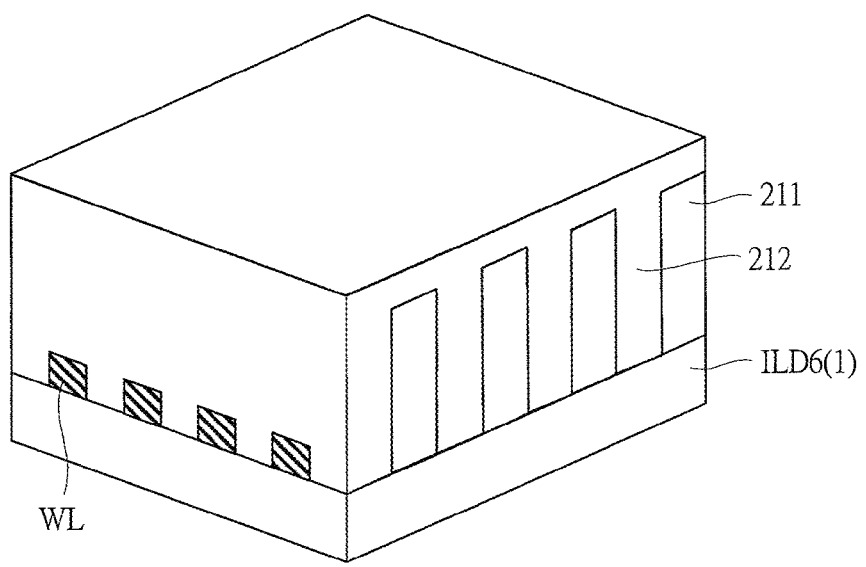
FIG. 27 is a perspective view showing the semiconductor memory device of the third embodiment in the manufacturing process.
Figure 28:
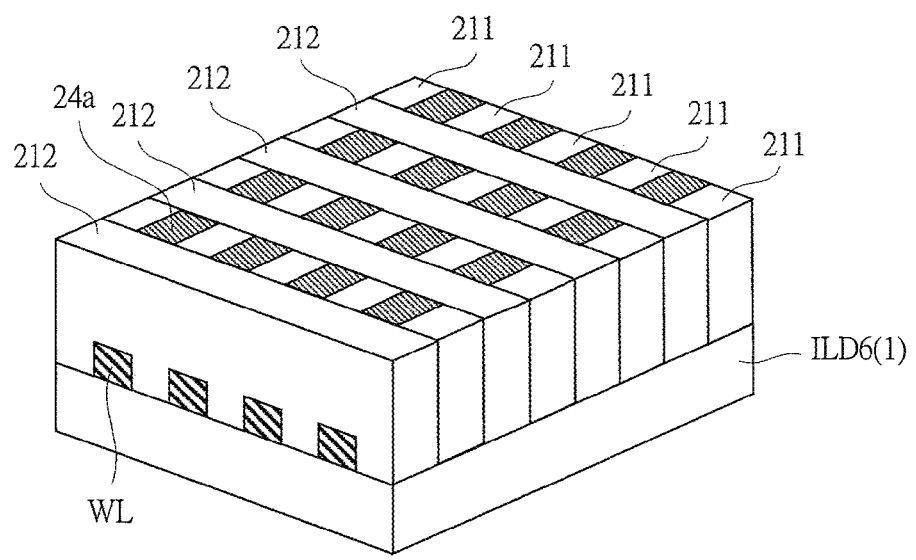
FIG. 28 is a perspective view showing the semiconductor memory device of the third embodiment in the manufacturing process.

Subsequently, by using the photolithography technique and dry etching technique, the structure shown in FIG. 25 is processed into a stripe pattern in a direction intersecting the word line WL. At this time, when the processing is carried out so as not to remove the word lines WL formed into the stripe pattern, the structure as shown in FIG. 26 is formed, and the stacked layer structure (diode stacked layer structure) made up of the amorphous silicon layers 22*a*, 23*a* and 24*a* is cut and separated into square columnar shapes. Next, as shown in FIG. 27, an insulating layer 212 made of, for example, silicon oxide is deposited so as to cover the separated stacked layer structures (diode stacked layer structures) and insulating layers 211, and as shown in FIG. 28, the insulating layers 211 and 212 are further polished by the CMP method or the like, thereby exposing the upper surface of the amorphous silicon layer 24*a*.

Figure 29:
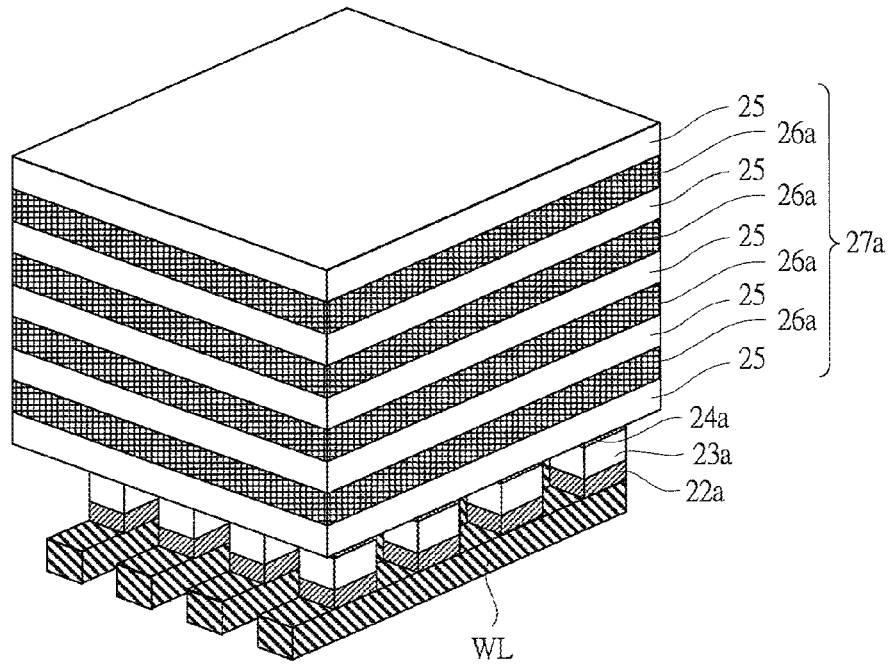
FIG. 29 is a perspective view showing the semiconductor memory device of the third embodiment in the manufacturing process.

Next, on the insulating layers 211 and 212 and the amorphous silicon layer 24*a*, insulating layers 25 and amorphous silicon layers 26*a* are alternately deposited repeatedly, so that a stacked body 27*a* in which the insulating layers 25 and the amorphous silicon layers 26*a* are alternately stacked repeatedly is formed, and the structure as shown in FIG. 29 is obtained.

Figure 30:
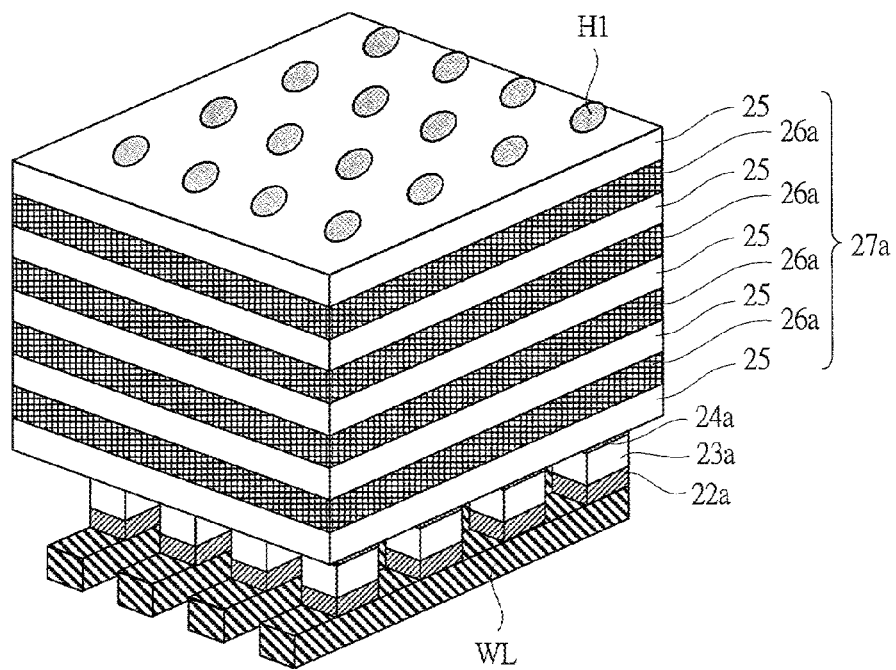
FIG. 30 is a perspective view showing the semiconductor memory device of the third embodiment in the manufacturing process.
Figure 31:
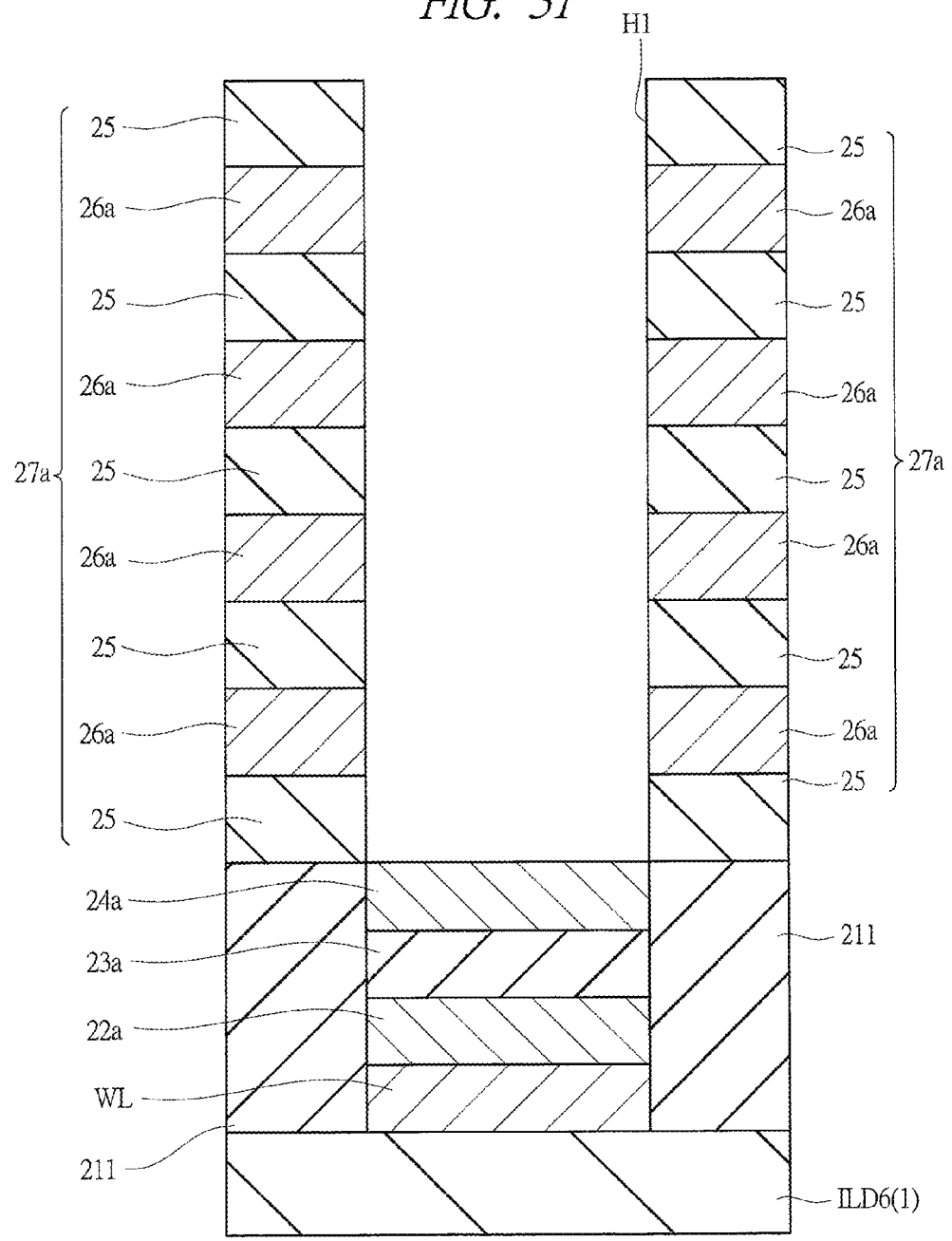
FIG. 31 is a cross-sectional view showing the semiconductor memory device of the third embodiment in the manufacturing process.

Next, connection holes (pore portions) that penetrate the stacked body 27*a* thus prepared are formed. By processing the stacked body 27*a* by the photolithography technique and dry etching technique, holes (pore portions) H1 that reach the amorphous silicon layers 24*a* are formed in the stacked body 27*a* as shown in FIG. 30. At this time, the processing is carried out so that the hole H1 is formed right above the stacked layer structure (diode stacked layer structure) made up of the amorphous silicon layers 22*a*, 23*a* and 24*a*. FIG. 31 is a diagram that shows a cross-sectional structure including one hole H1, and in the following description of the manufacturing process, only the cross-sectional views are used instead of perspective views in order show the inner structure of the hole H1 in an easily understood manner.

Figure 32:
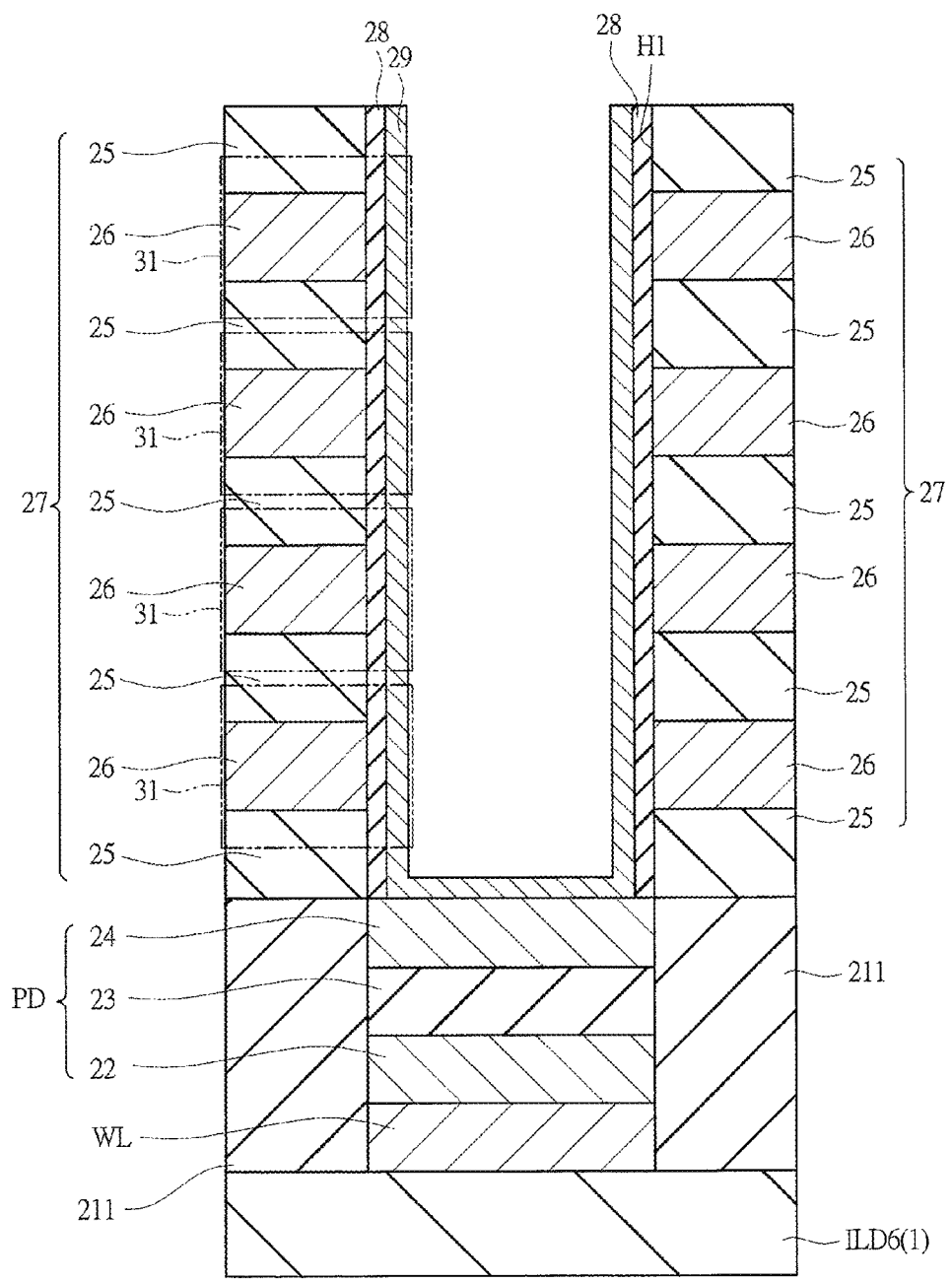
FIG. 32 is a cross-sectional view showing the semiconductor memory device of the third embodiment in the manufacturing process.

Next, after a silicon oxide film is deposited by the CVD method or the like so as to cover the upper surface of the stacked body 27*a* and the inner wall and the bottom of the hole H1, portions deposited on the stacked body 27*a* and the bottom of the hole H1 are anisotropically etched, thereby forming a gate insulating film 28 so as to cover the inner wall of the hole H1. Subsequently, an amorphous silicon layer is formed so as to cover the upper surface of the stacked body 27*a* and the inner wall and the bottom of the hole H1, and after an n-type impurity is ion-implanted and a heating treatment is carried out, a portion deposited on the stacked body 27a is removed by the dry etching technique or the like, thereby forming a polysilicon layer 29. Moreover, by carrying out the above-mentioned heating treatment, the amorphous silicon layers 22a, 23a, 24a and 26a are respectively converted into polysilicon layers 22, 23, 24 and 26, so that the structure as shown in FIG. 32 is obtained. At this time, on the word line WL, a polysilicon diode PD having a structure in which the polysilicon layer 22 doped with a p-type impurity at a high concentration, the polysilicon layer 23 doped with no impurity and the polysilicon layer 24 doped with an n-type impurity are stacked is formed. Moreover, the stacked body 27a in which the insulating layers 25 and the amorphous silicon layers 26a are alternately stacked is converted into a stacked body 27 in which the insulating layers 25 and the polysilicon layers 26 are alternately stacked. Furthermore, one polysilicon layer 26 and portions of the gate insulating film 28 and the polysilicon layer 29 corresponding to the one polysilicon layer 26 form a vertical MISFET 31. Note that the portion of the polysilicon layer 29 deposited on the stacked body 27 may be removed in the process in which portions of the recording film 30 located on the hole H1 and the stacked body 27 are polished by the CMP method or the like after the formation of the stacked layer portion 40.

Figure 33:
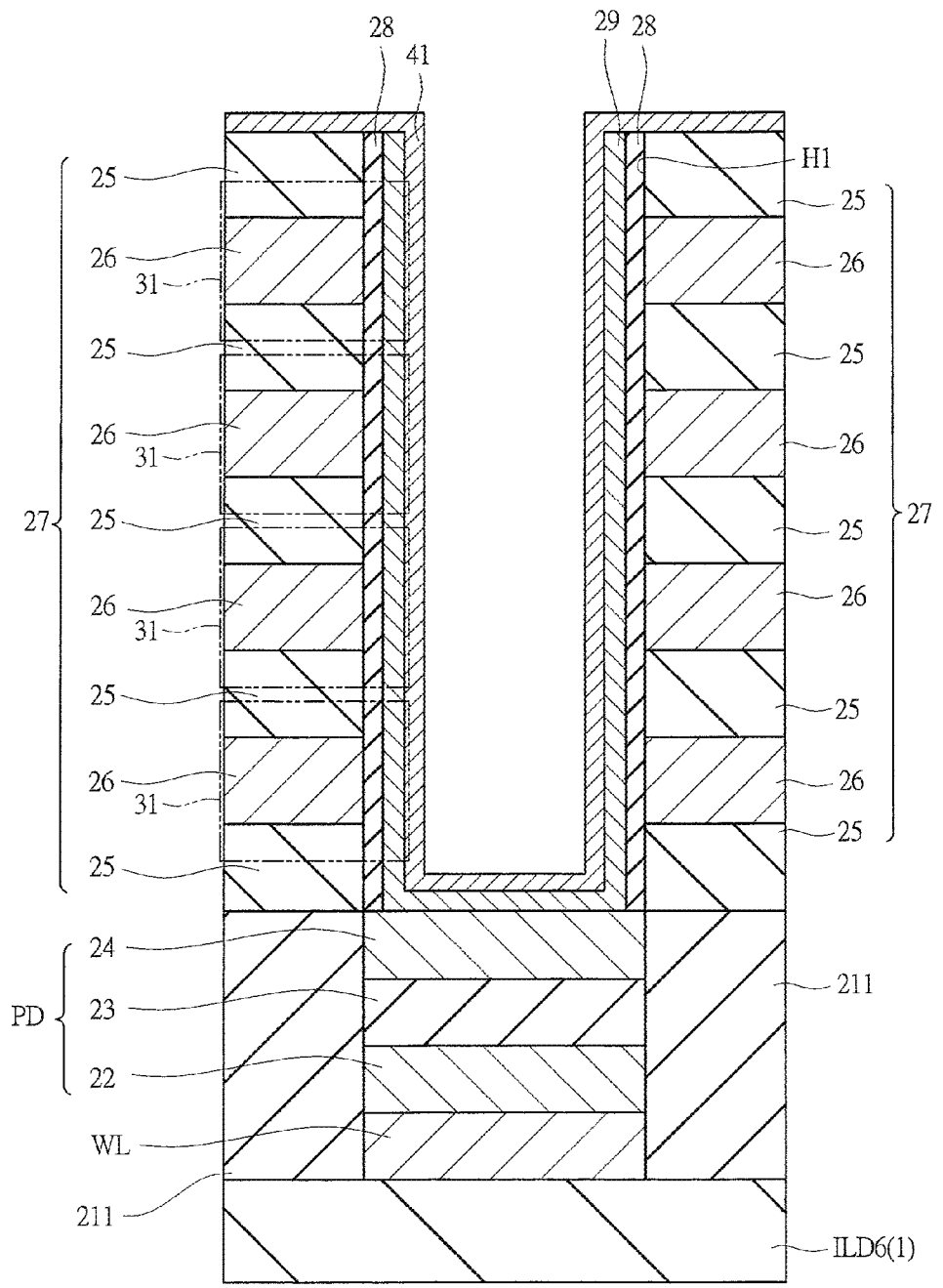
FIG. 33 is a cross-sectional view showing the semiconductor memory device of the third embodiment in the manufacturing process.

Next, as shown in FIG. 33, inside the hole H1 on which the polysilicon layer 29 has been formed, a first base layer 41 is formed so as to cover the inner wall and the bottom of the hole H1. In this process for forming the first base layer 41, the first base layer 41 made of a nitride or an oxide of a transition metal such as TiN or the like is formed by the sputtering method, the CVD method or the like so as to have a thickness of, for example, 0.5 nm or more to 2 nm or less. At this time, the surface of the first base layer 41 is made in parallel with the inner wall surface of the hole H1.

Figure 34:
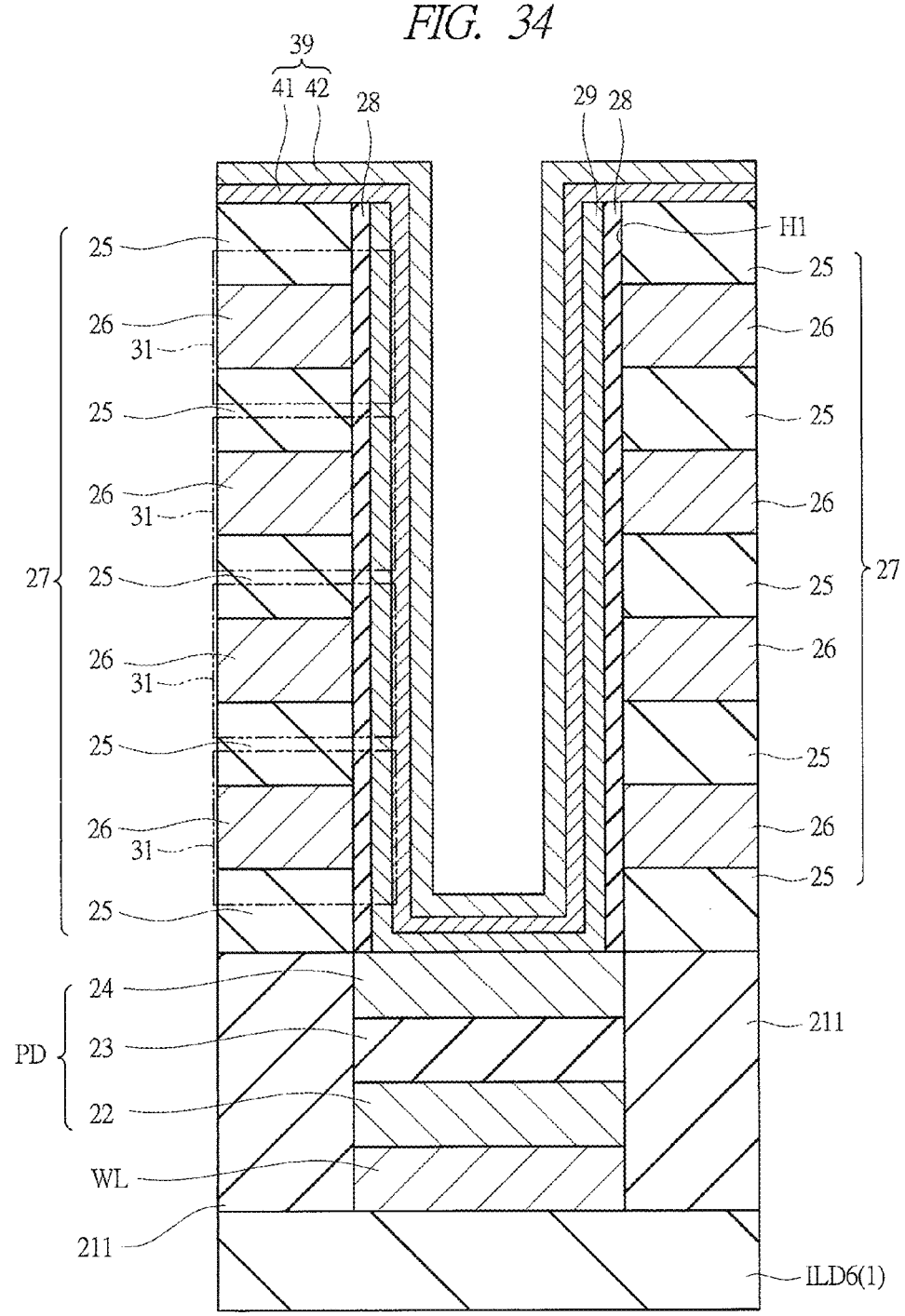
FIG. 34 is a cross-sectional view showing the semiconductor memory device of the third embodiment in the manufacturing process.

Next, as shown in FIG. 34, a second base layer 42 is formed in the hole H1 so as to cover the inner wall and the bottom of the hole H1 on which the first base layer 41 has been formed. In this process for forming the second base layer 42, the second base layer 42 made of a material having a hexagonal crystal structure such as Sb, $Sb_2Te_3$, $Bi_2Te_3$ or the like is formed by the sputtering method, the CVD method or the like so as to have a thickness of, for example, 1.0 nm or more to 10 nm or less. As a result, a base portion 39 composed of the first base layer 41 and the second base layer 42 is formed so as to cover the inner wall and the bottom of the hole H1. In the case where the second base layer 42 is made of a material having a hexagonal crystal structure, the second base layer 42 is (001)-oriented (c-axis oriented) relative to the surface of the first base layer 41. More specifically, the second base layer 42 is (001)-oriented (c-axis oriented) relative to the inner wall surface of the hole H1. Additionally, the temperature condition of the semiconductor substrate 1 in forming the second base layer 42 is the same as the temperature condition of the semiconductor substrate 1 in forming the second base layer 12 in the first embodiment.

Figure 35:
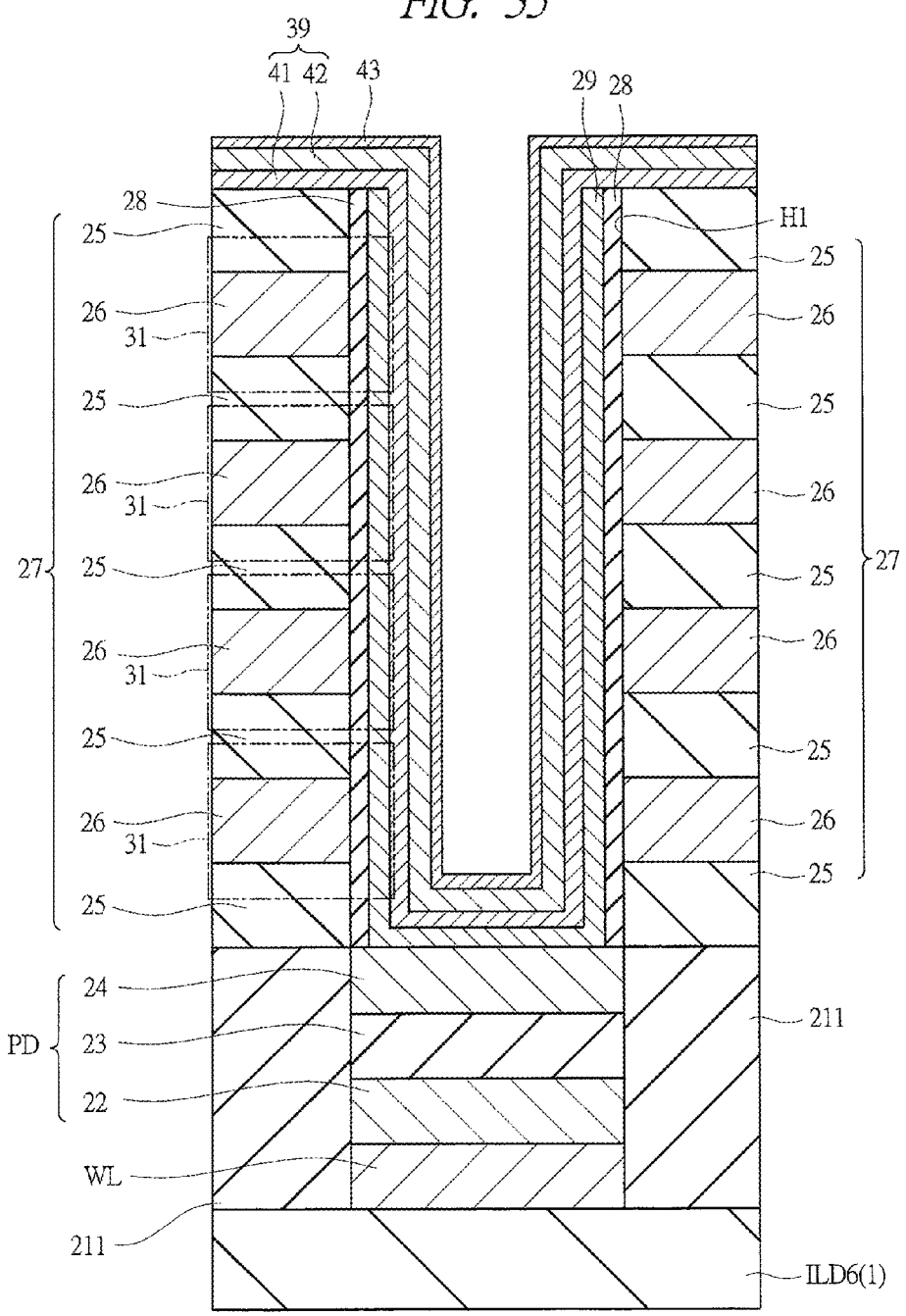
FIG. 35 is a cross-sectional view showing the semiconductor memory device of the third embodiment in the manufacturing process.

Next, as shown in FIG. 35, a first crystal layer 43 is formed in the hole H1 so as to cover the inner wall and the bottom of the hole H1 on which the second base layer 42 has been formed. In this process for forming the first crystal layer 43, the first crystal layer 43 made of a chalcogen compound (first chalcogen compound) such as GeTe or the like is formed by the sputtering method, the CVD method or the like so as to have a thickness of, for example, 0.33 nm or more to 2.0 nm or less. Preferably, the first chalcogen compound is a chalcogen compound that contains Ge, Sn or Mn and has a NaCl-type crystal structure (cubic crystal) in a low resistance state, and at this time, the first crystal layer 43 made of the first chalcogen compound is (111)-oriented relative to the surface of the second base layer 42.

Figure 36:
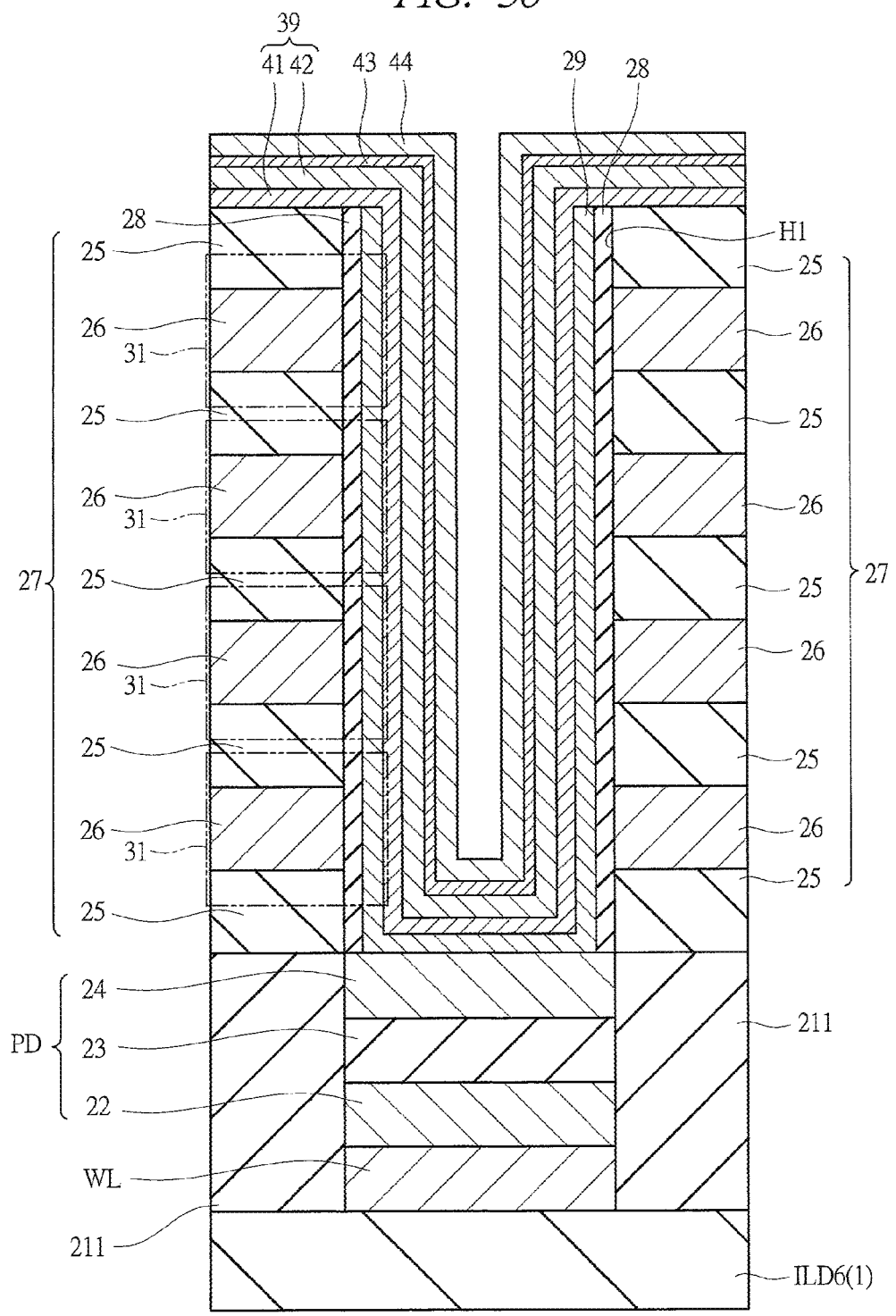
FIG. 36 is a cross-sectional view showing the semiconductor memory device of the third embodiment in the manufacturing process.

Next, as shown in FIG. 36, a second crystal layer 44 is formed in the hole H1 so as to cover the inner wall and the bottom of the hole H1 on which the first crystal layer 43 has been formed. In this process for forming the second crystal layer 44, the second crystal layer 44 made of a chalcogen compound such as $Sb_2Te_3$, $Bi_2Te_3$, $HfTe_2$, $Cu_2Te$, SnTe or the like (second chalcogen compound) or Sb is formed by the sputtering method, the CVD method or the like so as to have a thickness of, for example, 1.0 nm or more to 10 nm or less. Preferably, the second chalcogen compound is a chalcogen compound having a hexagonal crystal structure, and at this time, the second crystal layer 44 made of the second chalcogen compound is (001)-oriented (c-axis oriented) relative to the surface of the first crystal layer 43. Moreover, also when the second crystal layer 44 is made of Sb, it is (001)-oriented (c-axis oriented) relative to the surface of the first crystal layer 43.

Figure 37:
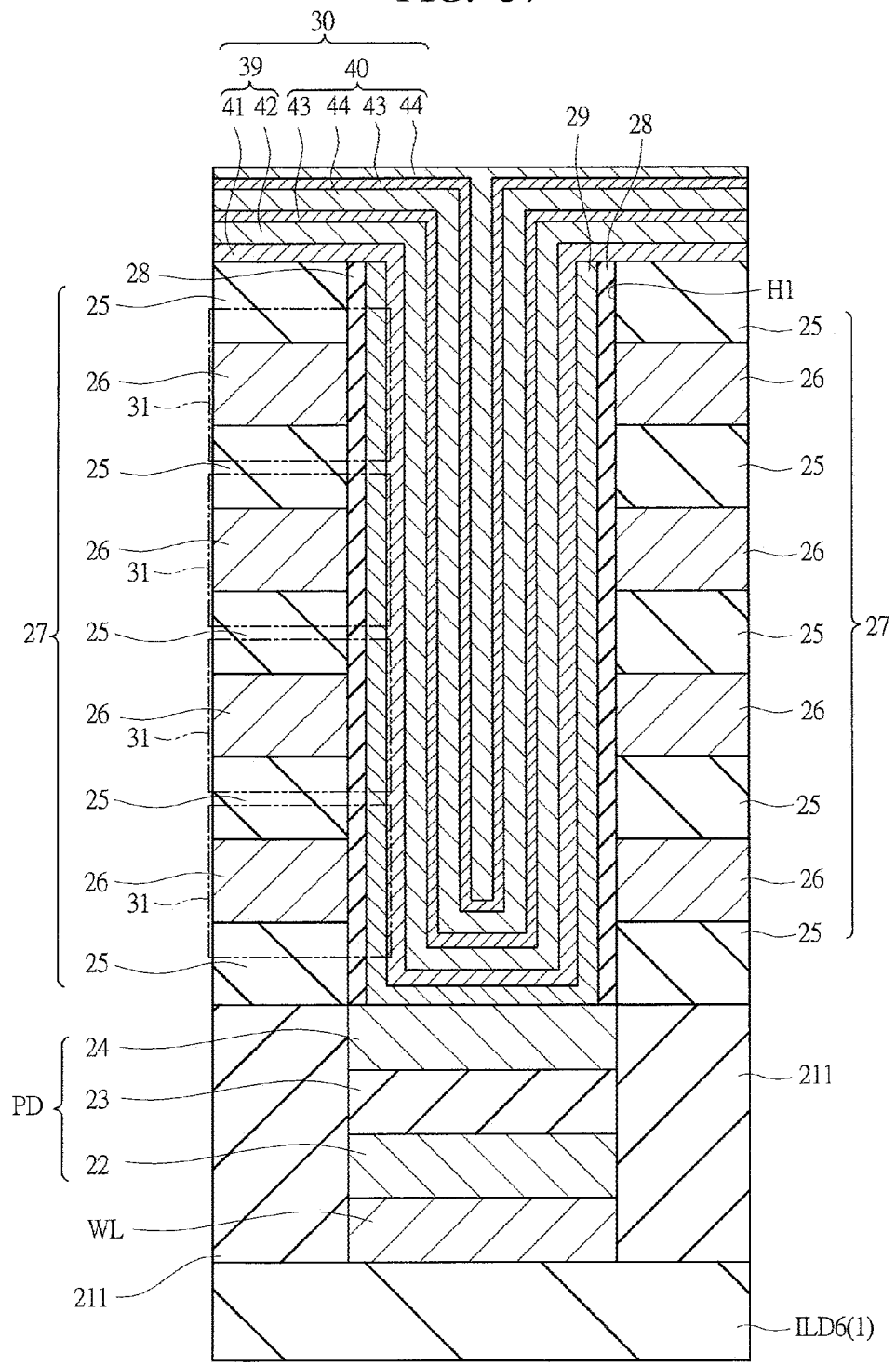
FIG. 37 is a cross-sectional view showing the semiconductor memory device of the third embodiment in the manufacturing process.

Thereafter, by alternately carrying out the process for forming the first crystal layer 43 and the process for forming the second crystal layer 44 repeatedly, the stacked layer portion 40 in which the first crystal layers 43 and the second crystal layers 44 are alternately stacked repeatedly as shown in FIG. 37 is formed. At this time, the first crystal layers 43 and the second crystal layers 44 are stacked in a direction perpendicular to the inner wall surface of the hole H1. Moreover, the stacking surface of the first crystal layer 43 is (111)-oriented, and the stacking surface of the second crystal layer 44 is (001)-oriented (c-axis oriented).

In the present embodiment, the process for forming the first base layer 41, the process for forming the second base layer 42, the process for forming the first crystal layer 43 and the process for forming the second crystal layer 44 are preferably carried out successively in a chamber of the same film-forming apparatus. In this manner, since the first base layer 41, the second base layer 42, the first crystal layer 43 and the second crystal layer 44 can be formed by the same film-forming method, the manufacturing process can be simplified.

Figure 38:
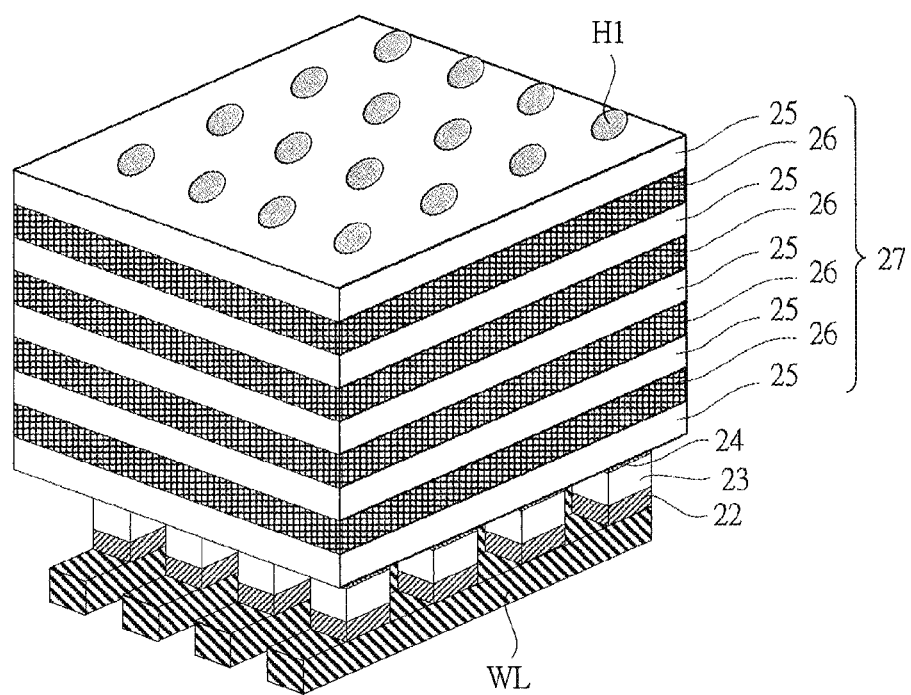
FIG. 38 is a perspective view showing the semiconductor memory device of the third embodiment in the manufacturing process.

Thereafter, by polishing portions of the recording film 30 located on the hole H1 and the stacked body 27 by the CMP method or the like, the hole H1 in which the gate insulating film 28, the polysilicon layer 29, the first base layer 41, the second base layer 42, the first crystal layer 43 and the second crystal layer 44 have been buried and the insulating layer 25 on the uppermost portion of the stacked body 27 are exposed, and the structure as shown in FIG. 38 is obtained. Then, a metal film made of, for example, W or the like is deposited on the hole H1 and the stacked body 27 by the sputtering method, the CVD method or the like, and the metal film is processed into a stripe pattern by using the photolithography technique and dry etching technique, thereby forming a bit line BL that intersects the word line WL and extends in a stripe pattern in a direction along the main surface of the semiconductor substrate 1, so that the structure as shown in FIG. 20 is obtained. In this manner, the memory cell MC3 as shown in FIG. 21 is formed.

The present embodiment differs from the first embodiment in that the first crystal layer 43 and the second crystal layer 44 are stacked in a direction perpendicular to the inner wall surface of the hole H1. However, the present embodiment is the same as the first embodiment in that the stacking surface of the first crystal layers 43 is (111)-oriented and Ge atoms existing at the interface with the second crystal layer 44 out of Ge atoms contained in the first crystal layer 43 are moved in a direction perpendicular to the stacking surface so as to change the bonding state of the Ge atom to adjacent atoms, thereby changing the resistance state of the recording film 30 from the low resistance state to the high resistance state. According to this semiconductor memory device, since the recording film 30 can be easily changed between the low resistance state and the high resistance state even if energy to be applied to the recording film 30 is comparatively small, it is possible to carry out a writing operation (programming operation) at a low power.

Moreover, since the base portion 39 has the first base layer (adhesive layer) 41 also in the present embodiment as shown in FIG. 21, it is possible to prevent the aggregation of the second base layer (orientation layer) 42 on the first base layer (adhesive layer) 41 and also to improve the flatness of the surface of the second base layer (orientation layer) 42 like the first embodiment.

Furthermore, as described with reference to FIGS. 21 and 22, in the present embodiment, since the memory cell MC3 includes a plurality of memory cells MC4, and the plurality of memory cells MC4 are formed in a direction perpendicular to the main surface of the semiconductor substrate 1. For this reason, the present embodiment makes it possible to easily form a memory with a larger capacity in comparison with any of the semiconductor memory devices of the first embodiment and the second embodiment.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be effectively applied to a semiconductor memory device and the manufacturing method thereof.

What is claimed is:

1. A semiconductor memory device which records information by changing an electric resistance of a recording film by use of a change in an atomic arrangement of the recording film, the recording film comprising:
   a first base layer formed on a substrate;
   a second base layer formed on the first base layer; and
   a stacked layer portion formed by sequentially stacking a first crystal layer made of a first chalcogen compound and a second crystal layer made of a second chalcogen compound having a composition different from that of the first chalcogen compound on the second base layer,
   wherein the second base layer improves an orientation of the stacked layer portion, and
   the first base layer prevents aggregation of the second base layer.

2. The semiconductor memory device according to claim 1, wherein the first base layer is made of a nitride or an oxide of a transition metal.

3. The semiconductor memory device according to claim 1, wherein the first base layer is made of a nitride or an oxide of one of Ti, Mn, Zr, Cr, Ni, Co and Fe.

4. A semiconductor memory device which records information by changing an electric resistance of a recording film by use of a change in an atomic arrangement of the recording film, the recording film comprising:
   a first base layer formed on a substrate;
   a second base layer formed on the first base layer; and
   a stacked layer portion formed by sequentially stacking a first crystal layer made of a first chalcogen compound and a second crystal layer made of a second chalcogen compound having a composition different from that of the first chalcogen compound on the second base layer,
   wherein the second base layer improves an orientation of the stacked layer portion, and
   the first base layer is made of a nitride or an oxide of a transition metal.

5. The semiconductor memory device according to claim 1, wherein the first base layer has a thickness in a range from 0.5 nm or more to 2 nm or less.

6. The semiconductor memory device according to claim 1, which records information by changing an electric resistance of the recording film between a high resistance state and a low resistance state by use of a change in an atomic arrangement of the recording film,
   wherein the first chalcogen compound contains Ge, Sn or Mn and has a NaCl-type crystal structure in the low resistance state.

7. The semiconductor memory device according to claim 1, wherein the second chalcogen compound is one of Sb2Te3, Cu2Te and HfTe2.

8. The semiconductor memory device according to claim 1, wherein the second base layer has a thickness in a range from 1 nm or more to 10 nm or less and is formed so as to cover the entire first base layer.

9. The semiconductor memory device according to claim 1, wherein the second base layer is made of one of Sb, Sb2Te3 and Bi2Te3.

10. The semiconductor memory device according to claim 1,
    wherein the second base layer has a hexagonal crystal structure, and a c-axis of the hexagonal crystal is oriented perpendicularly to a surface of the first base layer.

11. A manufacturing method of a semiconductor memory device comprising:
    a first step of forming a first base layer made of a nitride or an oxide of a transition metal on a substrate;
    a second step of forming, on the first base layer, a second base layer that has a hexagonal crystal structure whose c-axis is oriented perpendicularly to a surface of the first base layer;
    a third step of, after the second step, forming a first crystal layer made of a first chalcogen compound on the substrate; and
    a fourth step of, after the second step, forming a second crystal layer made of a second chalcogen compound having a composition different from that of the first chalcogen compound on the substrate.

12. The manufacturing method of a semiconductor memory device according to claim 11,
    wherein the third step and the fourth step are alternately carried out repeatedly.

13. The manufacturing method of a semiconductor memory device according to claim 11,
    wherein, in the second step, the second base layer is formed while heating the substrate at 100° C. or more.

* * * * *